United States Patent [19]

Morohashi

[11] Patent Number: 5,477,061
[45] Date of Patent: Dec. 19, 1995

[54] JOSEPHSON DEVICE HAVING AN OVERLAYER STRUCTURE WITH IMPROVED THERMAL STABILITY

[75] Inventor: Shinichi Morohashi, Kawasaki, Japan

[73] Assignee: Fujitsu Limited, Kawasaki, Japan

[21] Appl. No.: 762,779

[22] Filed: Sep. 20, 1991

[30] Foreign Application Priority Data

Sep. 20, 1990 [JP] Japan ................................. 2-248773
Feb. 20, 1991 [JP] Japan ................................. 3-026425

[51] Int. Cl.$^6$ ............................ H01L 39/12; H01L 39/22
[52] U.S. Cl. .............................. 257/35; 257/31; 257/32; 505/817; 505/874
[58] Field of Search ................. 357/4, 5; 505/805, 505/806, 817, 874; 257/31, 32, 33, 34, 35, 36

[56] References Cited

U.S. PATENT DOCUMENTS 3,392,126  7/1968  Bindari ........................... 505/806

FOREIGN PATENT DOCUMENTS

| 52990 | 4/1979 | Japan | 357/5 |
| 204185 | 12/1982 | Japan | 357/5 |
| 59-119881 | 7/1984 | Japan | 505/874 |
| 72187 | 4/1987 | Japan | 357/5 |
| 213286 | 9/1987 | Japan | 357/5 |
| 63-32974 | 2/1988 | Japan | 257/35 |
| 63-224274 | 9/1988 | Japan . | |
| 47083 | 2/1989 | Japan | 357/5 |
| 64-64276 | 3/1989 | Japan | 257/31 |
| 1-54770 | 3/1989 | Japan | 257/31 |
| 3-79090 | 4/1991 | Japan | 257/31 |

OTHER PUBLICATIONS

Shoji et al., "Josephson Tunnel Junctions with No, Non Double–Layered Electrodes", Japanese Journal of Applied Physics, vol. 21, No. 4, Apr. 1982, pp. L192–L194.
Shoji et al. "New Fabrication Process for Josephson Tunnel Junctions with (Niobium Nitride, Niobium) Double–Layered Electrodes", Appl. Phys. Lett. vol. 41, No. 11, Dec. 1, 1982, pp. 1097–1099.
Asano et al. "Fabrication of Al–Nb Josephson Junctions Using Oxidized Zr Overlayers," Japanese Journal of Appl. Phys., vol. 28, No. 3, Mar. 1986, pp. 4261–4263.
Brunner et al. "Metal–Oxide–Metal Tunneling Junctions on Ta and Nb: Background Conductivity Resulting From Different Oxide Barriers", J. Appl. Phys. vol. 53, No. 3, Mar. 1982, pp. 1596–1601.
Laibowitz, R. B., et al, "Multilayer Josephson Memory Device" IBM Technical Disclosure Bulletin, vol. 15, No. 11, Apr. 1973.
Laibowitz et al., "Josephson Junctions with Nb/Al Composite Electrodes", Applied Physics Letters, vol. 20, No. 7, 1 Apr. 1972, New York, N.Y. pp. 254–256.
Hoko et al., "vertically integrated Josephson circuits with stacked Nb/AIO$_x$/Nb junctions", International Electron Devices Meeting Technical Digest, 6 Dec. 1987, Washington, DC, pp. 385–388.
Kosaka et al., "Josephson address control unit 1C for a 4–bit Microcomputer Prototype", *IEEE Transactions on Magnetics, vol. 25, No. 2, Mar. 1989, New York, N.Y., pp. 789–794.*
Patent Abstracts of Japan, vol. 13, No. 18 (E–704) 17 Jan. 1989 & JP–A–63 224274 (Agency of Inductrial Science & Technology).

*Primary Examiner*—Sara W. Crane
*Assistant Examiner*—Alice W. Tang
*Attorney, Agent, or Firm*—Staas & Halsey

[57] ABSTRACT

A Josephson device comprises a first electrode layer of a superconducting material and containing Nb therein as a constituent element, an overlayer of a nitride of a refractory metal element provided on the first electrode layer, a barrier layer of an insulating compound that contains the metal element as a constituent element and acting as a barrier of a Josephson junction, the barrier layer being provided on the overlayer, and a second electrode layer of a superconducting material and containing Nb therein as a constituent element, the second electrode layer being provided on the barrier layer.

14 Claims, 41 Drawing Sheets

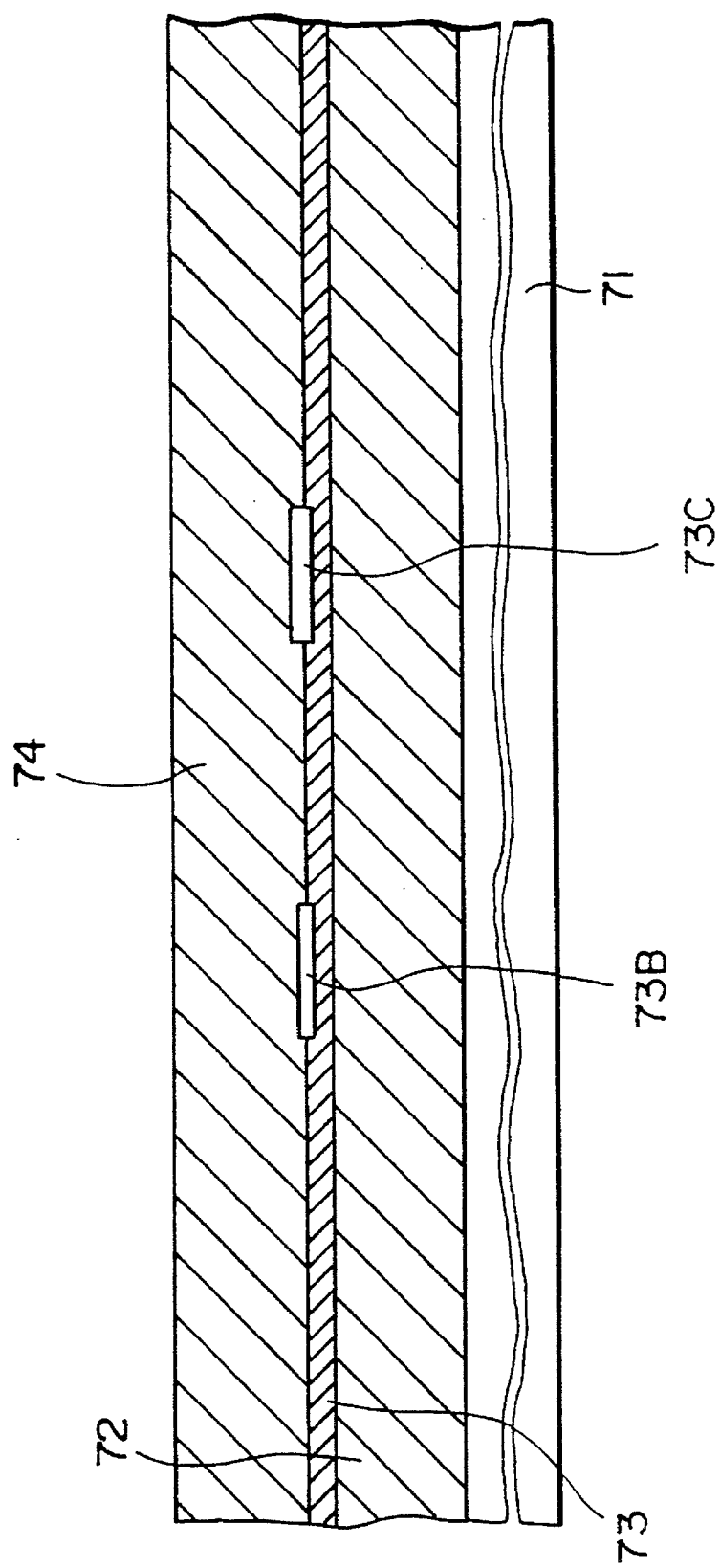

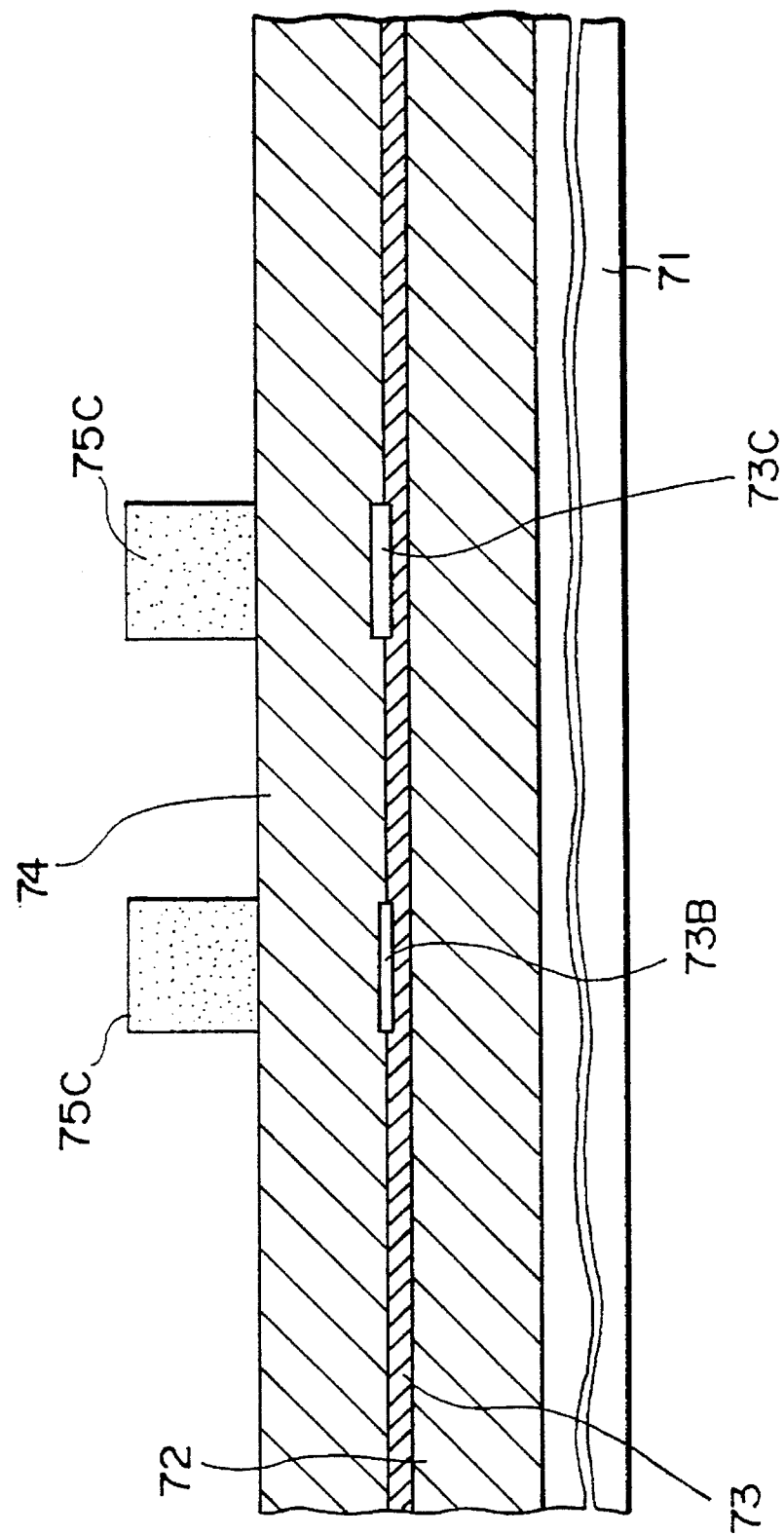

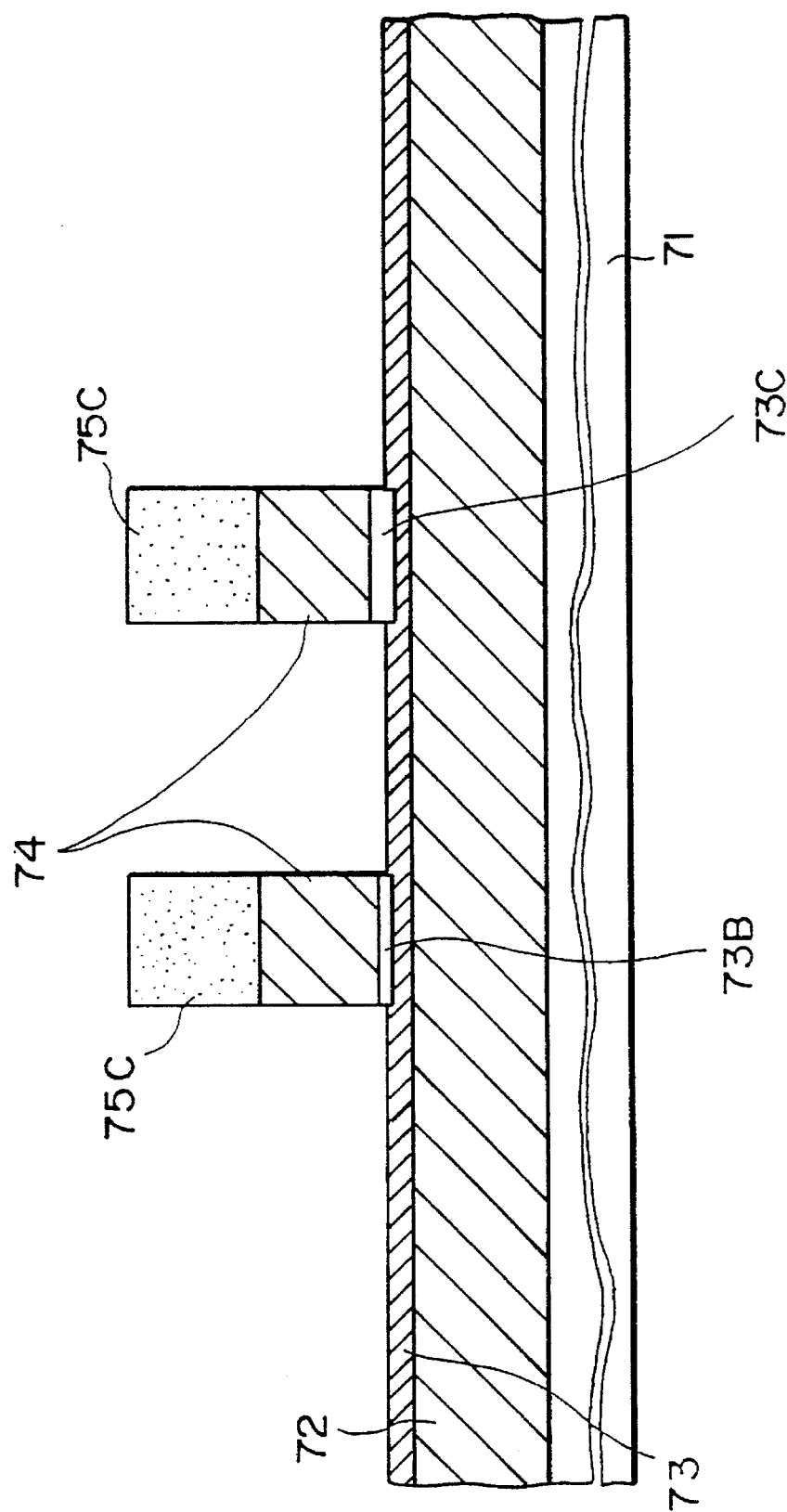

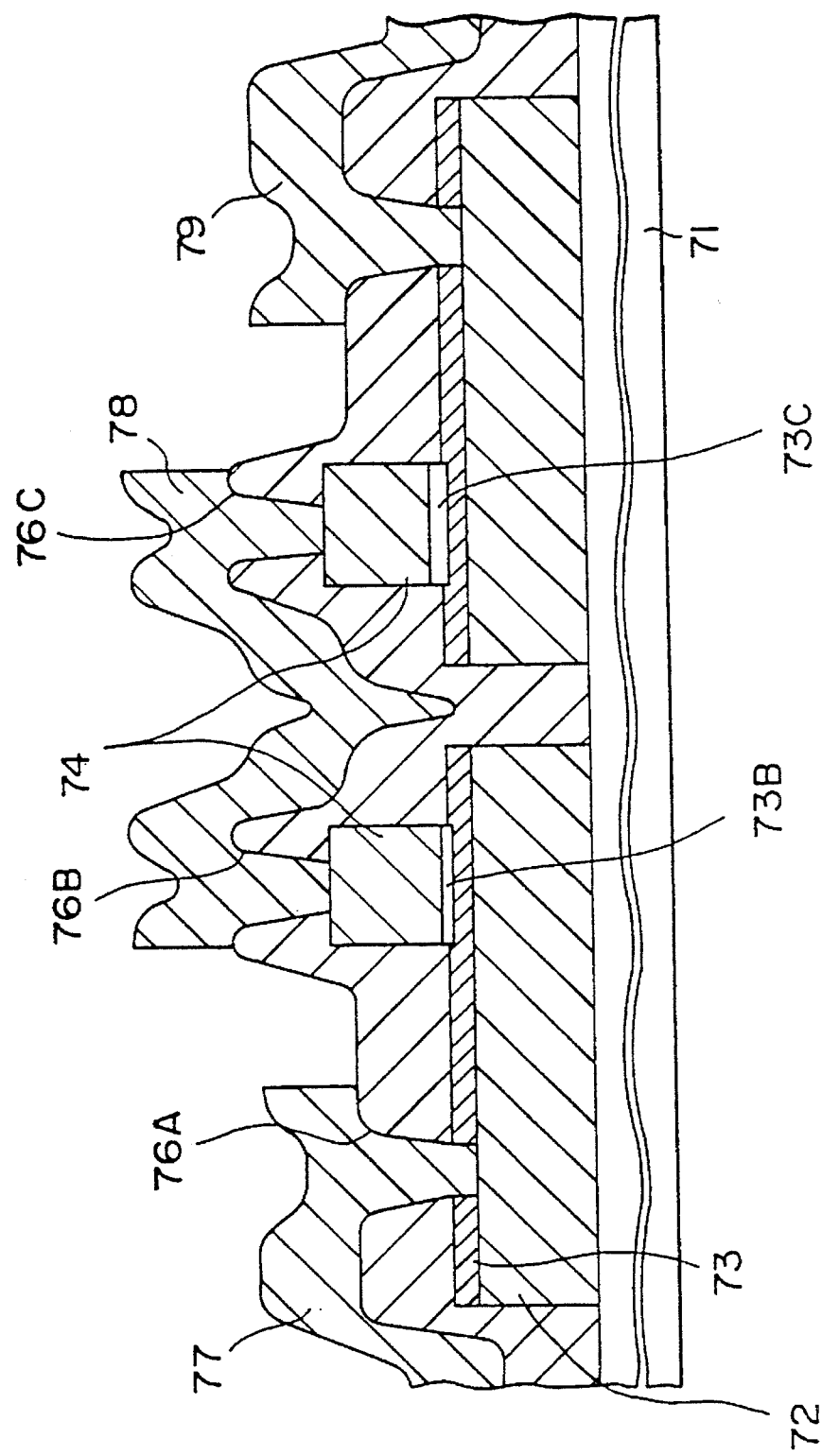

JOSEPHSON DEVICE HAVING AN OVERLAYER STRUCTURE WITH IMPROVED THERMAL STABILITY

BACKGROUND OF THE INVENTION

The present invention generally relates to superconducting devices and more particularly to a Josephson device that has an overlayer structure.

The Josephson devices are characterized by an extremely high operational speed and low power consumption, and are expected to play a major role in future super-fast computers and other digital devices. Further, the Josephson devices are extremely sensitive to magnetic fields and are used for analog applications, such as magnetic measurements, by constructing the superconducting quantum interference devices (SQUID).

Generally a Josephson junction is required to satisfy the following conditions:

(1) the Josephson junction should have a barrier layer that covers the lower superconducting electrode without forming a pinhole; and (2) the barrier layer should be an excellent insulator and be stable against various heat treatments applied during the fabrication process of the device.

Currently, a system of Nb/Al/AlO$_x$/Nb is known as the Josephson junction that satisfies the foregoing conditions.

FIG. 1 shows a typical structure of the Nb/Al/AlO$_x$/Nb system in cross section, wherein the Josephson device includes a lower superconducting electrode 104 of niobium that is formed on a silicon substrate 102. On the upper major surface of the lower electrode 104, an aluminum layer 106 is deposited as an overlayer. The aluminum overlayer 106 has an upper major surface that is slightly oxidized to form a barrier layer 108 of AlO$_x$. On the barrier layer 108, an upper superconducting electrode layer 110 of niobium is provided.

In the system of FIG. 1, the aluminum overlayer 106 covers partially the upper major surface of the niobium lower superconducting electrode 104 uniformly and without a pinhole even when the thickness of the layer 106 is in the order of 2–3 nm. The barrier layer of AlO$_x$, formed on the surface of the aluminum overlayer 106, exhibits excellent current-voltage characteristics for the barrier of the Josephson devices.

In addition to AlO$_x$, other materials such as tantalum o-zirconium are studied as a candidate for the overlayer. By oxidizing the surface of tantalum or zirconium overlayer, barrier layers having excellent characteristics are obtained. On the other hand, the attempt to form the Josephson junction that has the structure of Nb/NbOx/Nb has been failed. In this structure, the NbOx barrier layer is formed by the oxidation of the surface of the niobium superconducting electrode. It was found that NbO having the transition temperature of 1.4K is included in the NbOx barrier layer thus formed. In addition, oxygen in the NbOx barrier layer tends to react with niobium upon the barrier layer tends to react with niobium upon the deposition of the upper superconducting electrode on the barrier layer. Thereby, the property of the barrier layer is changed and the Josephson device having the above construction cannot exhibit the sharply defined threshold in the I–V characteristics.

In designing the Josephson device having the overlayer structure, one has to consider the so-called "proximity effect." The proximity effect is treated by the MacMillan's theory. Hereinafter, the proximity effect will be explained briefly with reference to FIG. 2.

Referring to FIG. 2, a superconducting layer S is provided in contact with a normal conduction layer N. The layer S has a thickness of d$_s$, while the layer N has a thickness of d$_n$. Further, respective layers have energy gaps $\Delta_s^{ph}$ and $\Delta_n^{ph}$. It should be noted that the energy gaps shown above correspond to the state wherein there is no proximity effect.

Now, the value of the energy gaps $\Delta_s^{ph}$ and $\Delta_n^{ph}$ is dependent on the lifetime broadening parameter $\Gamma_{s,n}$ that is defined as:

$$\Gamma_{s,n} = h/\tau_{s,n} = h \cdot v_F^{s,n} \cdot \sigma/2Bd_{s,n} \tag{1}$$

where h stands for the Planck's constant, $\tau_{s,n}$ stand for the lifetime of an electron in respective layers S and N, $V_F$ stands for the Fermi velocity, $d_{s,n}$ represent the layer thickness of respective layers S and N, B represents a function related to the ratio between the electron mean free path and the layer thickness, and $\sigma$ represents the probability of tunneling.

Using Eq. (1), the energy gaps $\Delta_n$ and $\Delta_s$ for respective layers N and S under the presence of the proximity effect are obtained according to the following equation:

$$\Delta_n(E) = \frac{(\Delta_n^{ph} + \Gamma_n \Delta_s(E)/(\Delta_s^2(E) - E)^{1/2})}{(1 + \Gamma_n/(\Delta_s^2(E) - E^2)^{1/2})} \tag{2}$$

$$\Delta_s(E) = \frac{(\Delta_s^{ph} + \Gamma_s \Delta_n(E)/(\Delta_n^2(E) - E)^{1/2})}{(1 + \Gamma_s/(\Delta_n^2(E) - E^2)^{1/2})} \tag{3}$$

where, $\Delta_n^{ph}$ and $\Delta_s^{ph}$ represent the respective energy gaps for the layer N and the layer S without the proximity effect. E represents the energy.

From Eqs. (2) and (3), it can be seen that the proximity effect increases with a decreasing lifetime broadening parameter $\Gamma_{s,n}$, and the value of the energy gap $\Delta_s$ (E) is decreased accordingly.

As can be understood from Eq. (1), the lifetime broadening parameter strongly depends on the Fermi velocity of the material forming the layers S and N, and one obtains a strong proximity effect when the material has a small Fermi velocity. Further, according to the Bardeen-Cooper-Schrieffer ("BCS") theory, it is known that the Fermi velocity is proportional to the coherent length. Thus, when a material having a small coherent length is used, the proximity effect would appear more strongly even when the layer thickness is held the game.

The condition that a Josephson junction having an aluminum overlayer exhibits excellent device characteristics is studied in detail. Briefly, the conditions are summarized as follows:

(1) The aluminum overlayer should cover the underlying niobium superconducting electrode with a thickness less than several nanometers in correspondence to the coherent length in the niobium electrode.

(2) The AlO$_x$ barrier layer formed by the oxidation of the surface of the aluminum overlayer should have an excellent thermal stability. Further, the AlO$_x$ layer should be an excellent insulator.

(3) The boundary between the aluminum overlayer and the niobium superconducting electrode should be clearly defined.

In order to satisfy the foregoing conditions, a fabrication process that provides minimum thermal as well as physical damaging to the layers deposited should be used. Because of this reason, a D.C. magnetron sputtering process is conventionally employed for depositing the niobium superconducting electrode and the aluminum overlayer.

Currently, an eight-bit digital signal processor is realized by using a Josephson integrated circuit that include about 6300 gates. In this integrated circuit, about 25000 Josephson junctions of the Nb/Al/AlO$_x$/Nb construction are used. In designing future Josephson integrated circuits having 10,000 gates or more, on the other hand, various improvements are needed to reduce the problems such as disconnection of interconnection patterns or short coerced of the interconnection patterns, in addition to the improvement of the reliability of the Josephson junction itself. Such improvement includes the improvement in the reliability of peripheral processes.

Meanwhile, current integrated circuits of Josephson devices generally have a structure shown in FIG. 3 (A).

Referring to the drawing, the integrated circuit is constructed on a silicon substrate 122 and includes a niobium ground plane 124 formed on the upper major surface of the silicon substrate 122. On the ground plane 124, there is provided a silicon oxide insulation layer 126, and niobium electrodes 130a and 130b as well as circuit elements 128 such as molybdenum resistance element are provided on the upper major surface of the silicon oxide layer 126. In the illustrated example, the niobium electrode 130a is connected to the niobium electrode 130b via the molybdenum resistance element 128.

On the niobium electrodes 130a and 130b, there are formed AlO$_x$ barrier layer 132a and 132b respectively, wherein an upper niobium electrode 134a is provided on the AlO$_x$ barrier layer 132a and an upper niobium electrode 134b is provided on the AlO$_x$ barrier layer 132b. Further, the molybdenum resistance element 128, the lower niobium electrodes 130a and 130b, and the upper niobium electrodes 134a and 134b are covered by a silicon oxide insulation layer 136. The silicon oxide layer 136 is provided with contact holes that expose the upper niobium electrodes 134a and 134b respectively, and a niobium superconducting interconnection pattern 138 is provided on the silicon oxide layer 136 in contact with the niobium electrode 134a and 134b via the contact holes.

In the conventional Josephson integrated of FIG.3 (A), there is a problem of unreliable interconnection because of the irregular surface morphology of the silicon oxide layer 136. More specifically, the silicon oxide layer 136 includes a number of steps and these steps tend to cause disconnection of the interconnection pattern.

Because of this reason, an integrated circuit having a planarized structure is studied.

FIG.3 (B) shows a structure of the Josephson integrated circuit wherein planarized niobium electrodes 130a and 130b are used in place of the electrodes 130a and 130b. The structure shown in FIG.3 (B) may be easily fabricated by the planarization techniques that are used commonly in the semiconductor fabrication processes. More specifically, such a planarization technique may include processes such as etch back or bias sputtering.

When using these planarization techniques, one has to keep in mind that such a process may include a heat treatment process at 150°–200° C. In correspondence to this, the Josephson devices that are formed in the integrated circuit must endure the heat treatment conducted at about 200° C.

The inventors have studies the temperature durability of the Josephson junction having the foregoing Nb/Al/AlO$_x$/Nb structure.

FIG.4 (A) shows a voltage-current characteristic curve of the Josephson junction measured without heat treatment. As can be seen clearly in the drawing the Josephson device shows a clear gap voltage for the finite voltage state and provides substantial no output current as long as the device is in the finite voltage state. In the superconducting state, on the other hand, the device provides a finite current even when there is no voltage applied to the device. Thus, one can clearly distinguish the finite voltage state and the zero voltage state from the current flowing through the Josephson junction.

FIG. 4(B) shows the voltage-current characteristic curve of the foregoing Josephson device after a heat treatment conducted at 200° C. As can be seen in FIG. 4(B), the characteristic curve is characterized by a ill-defined gap voltage for the finite voltage state, and the current flowing through the Josephson junction increases gradually with increasing voltage applied across the niobium superconducting electrodes. In such a device, a finite current flows through the Josephson junction and it becomes difficult to distinguish the state of the Josephson device from the current flowing therethrough. Thereby, the digital application of the Josephson device becomes considerably difficult.

The inventors have further studied the reason of this degradation of the voltage-current characteristic by the Auger electron spectroscopy and found a result shown in FIGS. 5(A) and 5(B), wherein FIG. 5(A) shows the structure of the Josephson junction and FIG. 5(B) shows the signal intensity representing the concentration of various elements as a function of the etching time.

Referring to FIG. 5(B), it can be seen that there appears a change in the concentration of aluminum and niobium particularly at the interface between the niobium electrode 104 and the aluminum overlayer 106 in the experiment for the as-formed device and in the experiment for the device heat treated at 200° C. More specifically, the boundary between the niobium electrode 104 and the aluminum overlayer 106 is blurred somewhat after the heat treatment.

In order to confirm the foregoing finding, a series of measurements were made to confirm the distribution profile of various elements in the device for the samples that include the device as formed, the device applied with heat treatment at 200° C., the device applied with heat treatment at 300° C. and the device applied with heat treatment at 400° C.

FIGS. 6(A) and 6(B) show the result of measurement, wherein FIG. 6(A) merely shows the structure of the device that is used for the measurement.

As can be seen in the distribution profile of FIG. 6(B), aluminum atoms in the aluminum overlayer 106 cause a diffusion into the underlying niobium electrode 104 with the heat treatment. With increasing temperature of the heat treatment, the diffusion is enhanced and the depth of aluminum reaching in the niobium electrode 104 increases.

The foregoing finding suggests that the diffusion of aluminum is caused due to the fact that aluminum is a typical low melting metal. It is believed that this diffusion of aluminum is caused due to the columnar texture of the niobium electrode 104. More specifically, the niobium electrode is formed from a number of columnar crystals aligned generally vertically to the surface of the electrode, and aluminum may penetrate into the electrode 104 along the grain boundary formed between the columnar crystals.

The foregoing result leads to the conclusion that, as long as aluminum is used for the overlayer, one cannot avoid the problem of degradation in the characteristics of the Josephson device and the Josephson integrated circuit having a planarized structure for interconnection cannot be achieved, as long as the Josephson device uses the aluminum overlayer.

There are investigations in search of Josephson junctions that show an improved durability against heat treatments. For example, Josephson devices that use a tantalum or zirconium overlayer have been proposed in combination with the niobium upper and lower electrodes. The barrier layer is formed by the oxidation of the tantalum or zirconium overlayer.

In the XPS (X-ray photoelectron spectroscopy) analysis, it is confirmed that these Josephson devices do show an excellent stability against the heat treatment.

FIGS. 7(A)–7(C) show the results of the XPS analysis for the device that uses a tantalum overlayer, wherein FIG. 7(A) shows the device structure, FIG. 7(B) shows the atomic concentration profile for the sample that is formed as it is, and FIG. 7(B) shows the atomic concentration profile for the sample that is heat treat at 250° C. for 1 hour.

As can be seen in FIGS. 7(B) and 7(C), the distribution profile of tantalum does not change substantially even after the heat treatment. Associated therewith, there is no substantial change in the atomic concentration profile at the boundary between the tantalum overlayer and the underlying niobium electrode. The same result was obtained for the device that uses a zirconium overlayer.

About the possibility of use of the tantalum or zirconium overlayer for the Josephson junction, the inventors have made a more detailed examination by using the SIMS (secondary ion mass spectroscopy) analysis.

FIGS. 8(A) and 8(B) show the result of the SIMS analysis for the Josephson junction having the zirconium overlayer, wherein FIG. 8(A) shows the structure of the device and FIG. 8(B) shows the count of the secondary electrons for respective elements a function of the depth, measured from the top surface of the upper niobium electrode to the bottom surface of the silicon substrate. In FIG. 8(B), the curve designated as (A) represents the distribution profile of zirconium atoms for the device formed as it is, the curve designated as (B) represents the same distribution profile for the device that was subjected to the heat treatment at 200° C. for 1 hour, the curve designated as (C) represents the same distribution profile for the device that was subjected to the heat treatment at 300° C. for 1 hour, and (D) represents the same distribution profile for the device that was subjected to the heat treatment at 400° C. for 1 hour. As can be seen clearly in the curve (D), the concentration profile has changed due to the heat treatment, indicating that the diffusion of zirconium has occurred.

FIGS. 9(A) and 9(B) show a result similar to FIGS. 8(A) and 8(B), wherein tantalum is used for the overlayer instead of zirconium. In this case, too, one can see a slight change in the concentration profile of tantalum with the heat treatment applied at 200° C., 300° C. and 400° C. Similar to FIG. 8(B), the curve (A) shows the result for the device formed as it is, the curve (B) shows the result for the device heat treated at 200° C., the curve (C) shows the result for the device heat treated at 300° C., and the curve (D) shows the result for the device that was heat treated at 400° C.

Further, the voltage-current characteristic of the Josephson junction was checked for the device of FIG. 8(A) and the device of FIG. 9(A). In this experiment, there was observed the degradation of the characteristic, similar to that shown in FIG. 4(B) for the device that was subjected to the heat treatment at 300° C.

Thus, the conventional Josephson devices have the problem of durability against heat treatment, which is unsolved, and there is a demand for a device that shows stable and satisfactory characteristics even though subjected to the heat treatment that is generally used in the planarization process.

Meanwhile, in the Josephson devices in general, one can increase the operational speed of the logic devices or increase the signal to noise ratio when one can use a material having a higher critical temperature Tc for the superconduction transition. For example, when one can use a material having the critical temperature Tc that is higher than 10K, one can increase the energy gap of the material and hence the output current when such a device is operated at the liquid helium temperature. Further, when such a high Tc material can be used for the Josephson devices, it is expected that the cooling system, for maintaining the Josephson device and the integrated circuits in the low temperature environment necessary for the operation, would be simplified.

To the date, however, the fabrication of the Josephson junction that operates with satisfactory performance has been successful only in the system of $Nb/Al/AlO_x/Nb$ that uses niobium for the electrodes and aluminum for the overlayer. In this system, however, one cannot achieve the critical temperature Tc exceeding 10K.

As a material having the critical temperature Tc that exceeds 10K, several materials such as NbN or NbCN are known. Thus, there are attempts to fabricate a Josephson device by using these materials for the electrodes. For example, there is an attempt to fabricate a Josephson junction by providing a lower NbN electrode on an silicon substrate, forming a barrier layer of NbOx by oxidizing the surface of the NbN electrode by an r.f. plasma oxidation process, and providing an upper NbN electrode on the barrier layer. In this device, however, the NbOx barrier layer cannot cover the upper major surface of the NbN electrode without forming pinholes and no successful result is reported. Further, there are attempts to deposit amorphous silicon of MgO on the lower NbN electrode. In the latter case, one has to form the barrier layer of amorphous silicon or MgO with a thickness in the order of 1 nm or less. However, the technique to grow a layer of a first composition on an underlying layer of a different composition with such a small thickness and uniformity by deposition has not yet been established.

SUMMARY OF THE INVENTION

Accordingly, it is a general object of the present invention to provide a novel and useful Josephson device, wherein the foregoing problems are eliminated.

Another and more specific object of the present invention is to provide a Josephson device having an improved durability against heat treatment, and a fabrication process thereof.

Another object of the present invention is to provide a Josephson device that uses a superconducting material having a critical temperature exceeding 10K for the electrode.

Another object of the present invention is to provide a Josephson device that includes a lower superconducting electrode of a material containing Nb, an overlayer of a nitride of a refractory metal deposited on the upper maj surface of the lower superconducting electrode, a barrier layer of an oxide of the refractory metal and formed on the upper major surface of the overlayer by an oxidizing process applied to the upper major surface of the overlayer, and a second superconducting electrode of a material containing Nb. According to the present invention, the diffusion of the refractory element into the lower superconducting electrode is prevented by forming the overlayer of the nitride. Thereby, even when a heat treatment process is applied, the diffusion of the refractory metals in the overlayer into the lower superconducting electrode does not occur. Thus, the Josephson device of the present invention is suited for the Josephson integrated circuits which are subjected to a planarization process during the fabrication thereof.

Another object of the present invention is to provide a Josephson device that includes a lower superconducting electrode of NbN or NbCN, an overlayer of a nitride of a refractory metal provided on the upper major surface of the lower superconducting electrode, a barrier layer of a material containing the refractory metal and formed by modifying the upper major surface of the overlayer, and an upper superconducting electrode of NbN or NbCN. According to the present invention, a material having a high critical temperature is used for the superconducting electrodes and one can operate the device in the 10K environment. Further, one can increase the energy gap by operating the device in the liquid helium environment. Thereby, one can increase the output current and decrease the signal-to-noise ratio in the analog applications. Further, the operational speed is increased in the digital applications. Furthermore, one can simplify the cooling system that is used for maintaining the device in the operational state.

Other objects and further features of the present invention will become apparent from the following detailed description when read in conjunction with the attached drawings.

DETAILED DESCRIPTION OF PREFERRED EMBODIMENTS

Figure 1:
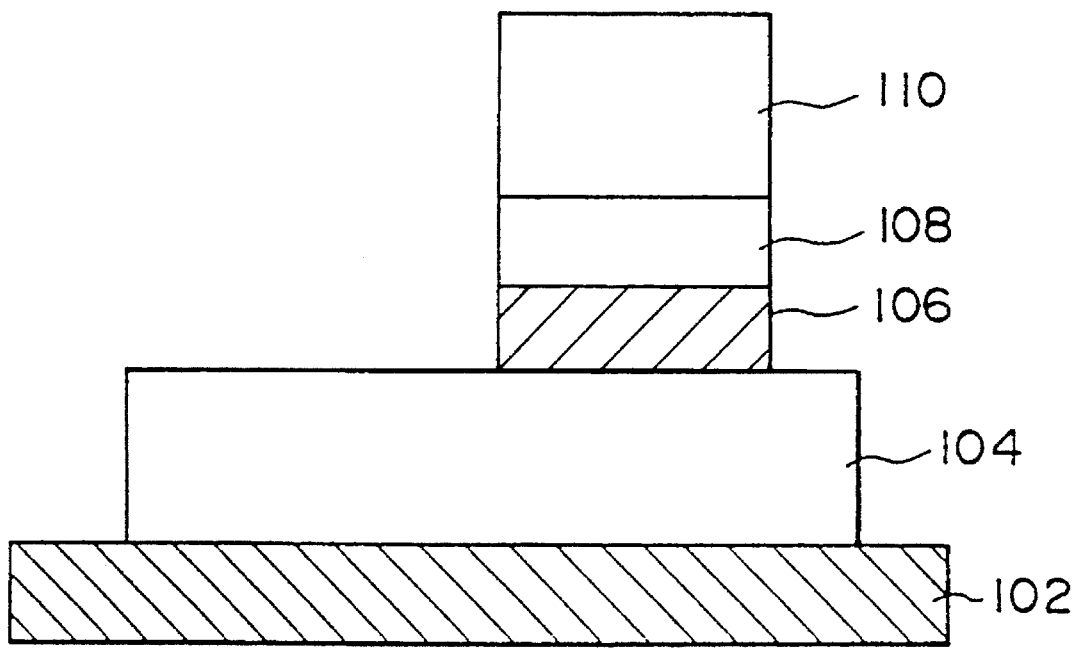
FIG. 1 is a diagram showing the structure of a conventional Josephson junction.
Figure 2:
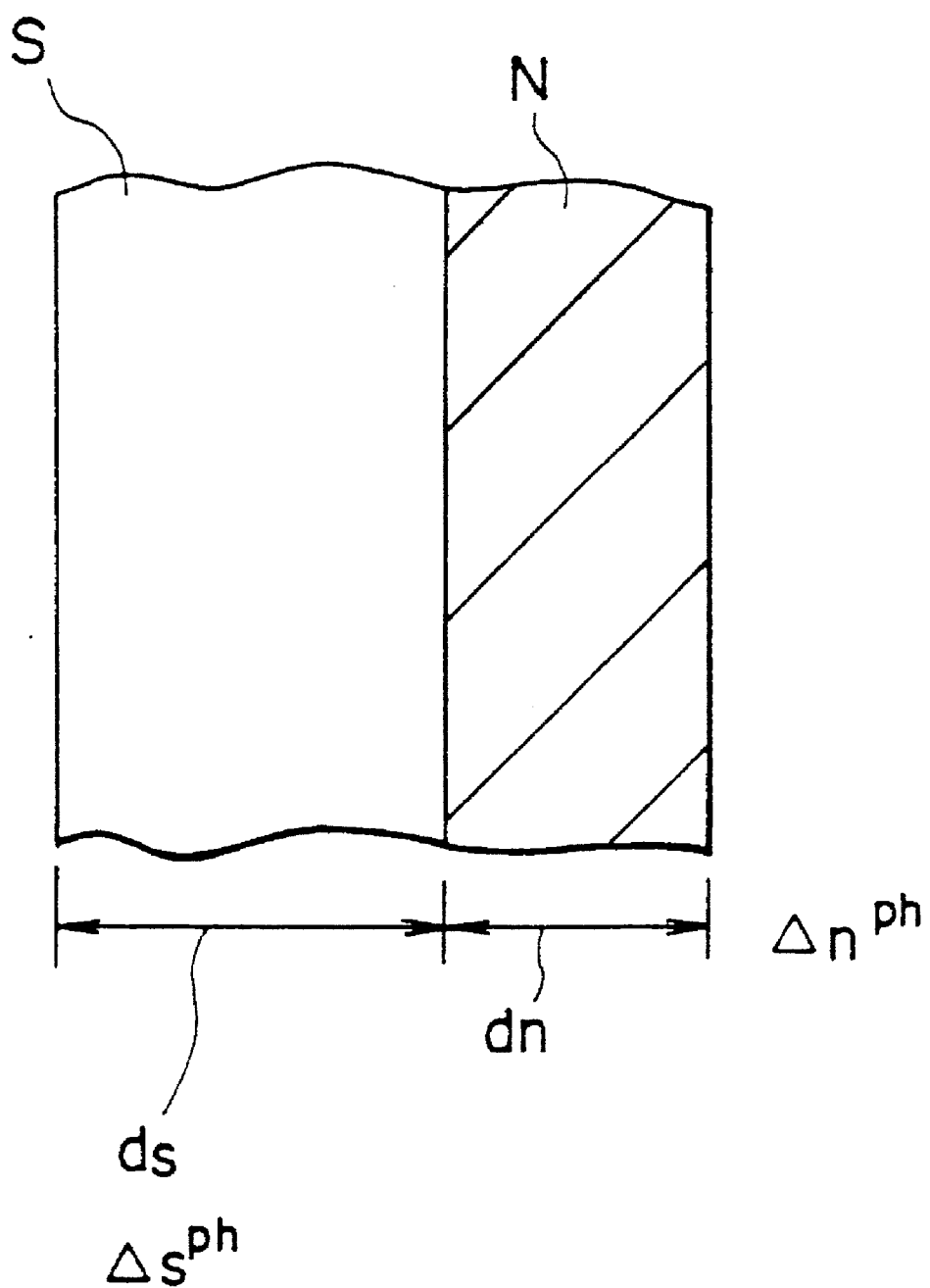
FIG. 2 is a diagram for explaining the proximity effect.
Figure 3A:
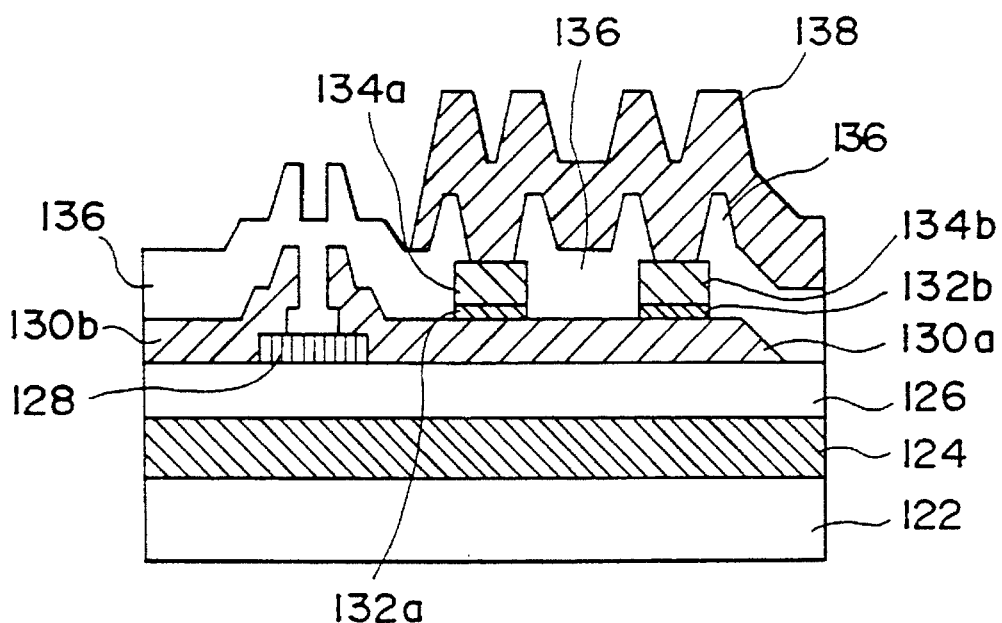
FIGS. 3(A) and 3(B) are diagrams respectively showing the structure of a conventional Josephson device and the structure of a Josephson device envisioned for the future and having a planarized surface.
Figure 3B:
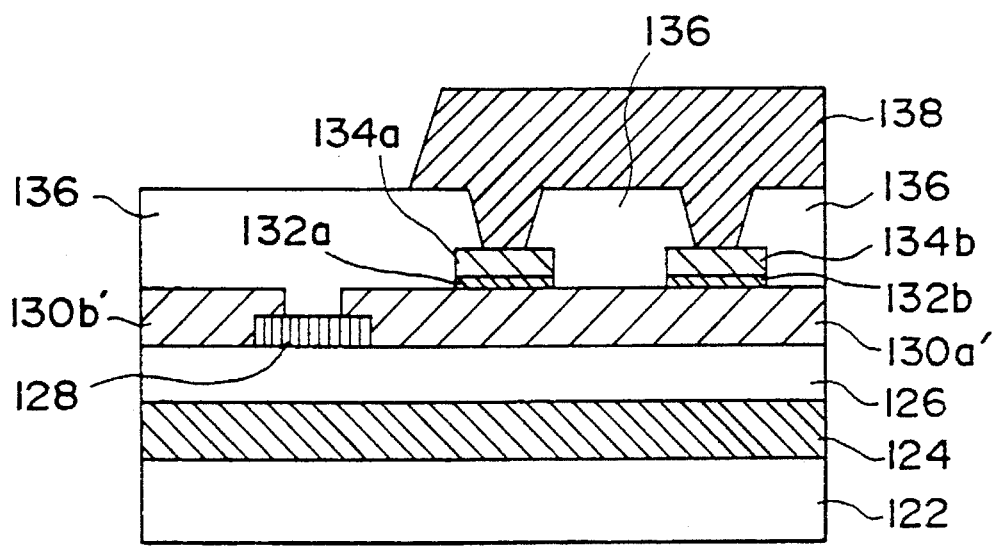
Figure 4A:
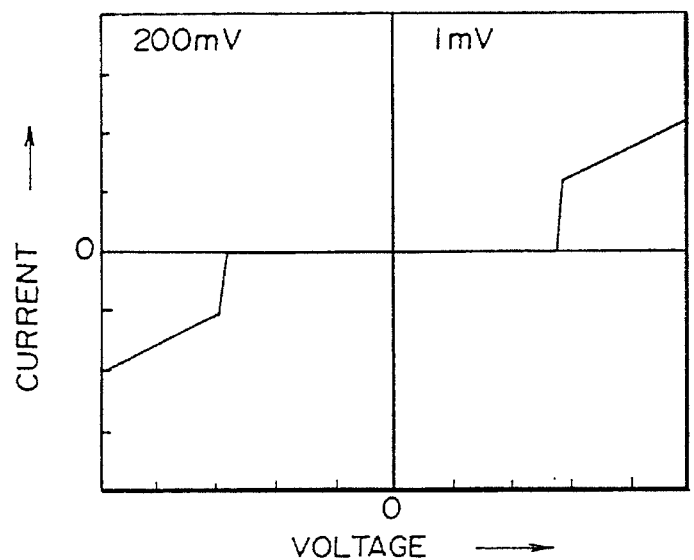
FIGS. 4(A) and 4(B) are diagrams showing a voltage-current characteristic curve of the conventional Josephson device respectively in the as-formed state and after a heat treatment.
Figure 4B:
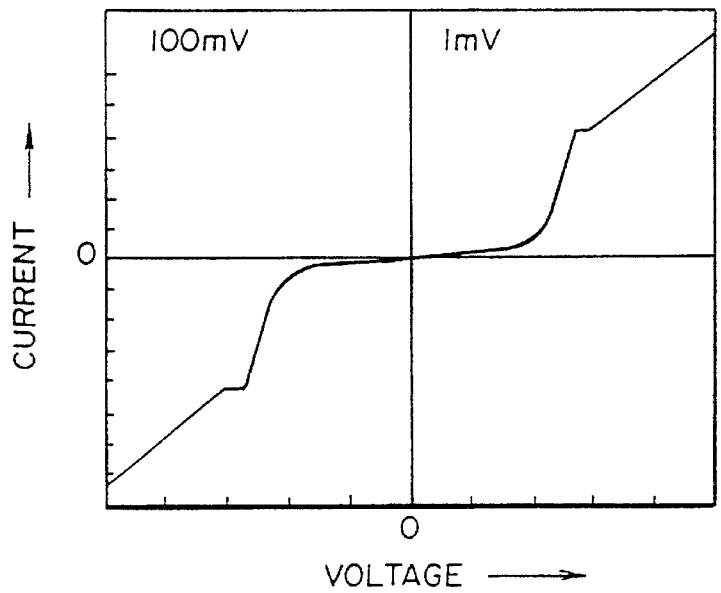
Figure 5A:
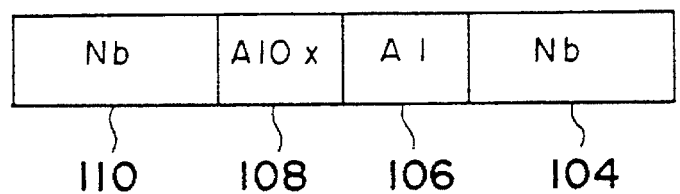
FIGS. 5(A) and 5(B) are diagrams respectively showing the structure of the conventional Josephson junction having an aluminum overlayer and a distribution profile of elements in the device structure before and after a heat treatment.
Figure 5B:
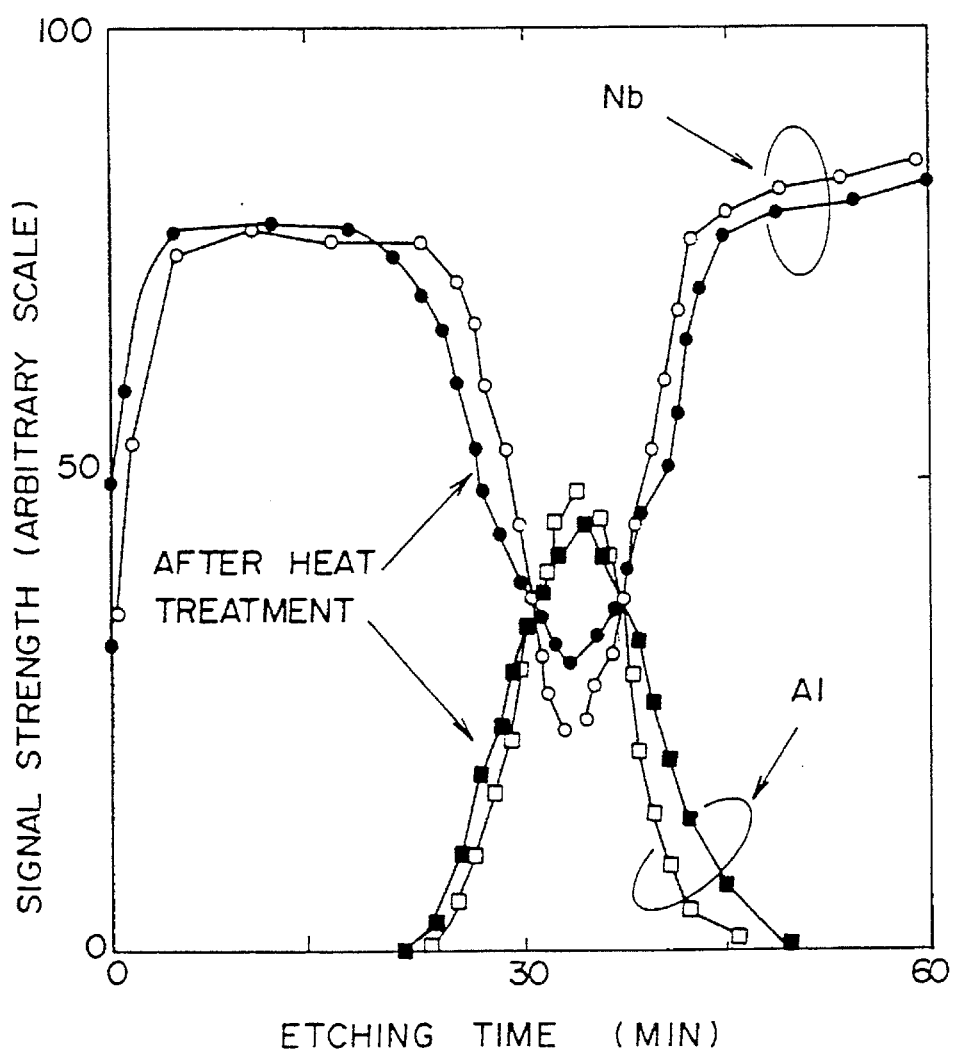
Figure 6A:
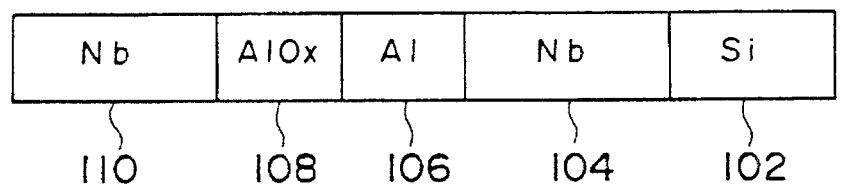
FIG. 6(A) and 6(B) are diagrams respectively showing the structure of the conventional Josephson junction shown in FIG. 5(A) and the distribution profile of elements in the device structure after the heat treatment at various temperatures.
Figure 6B:
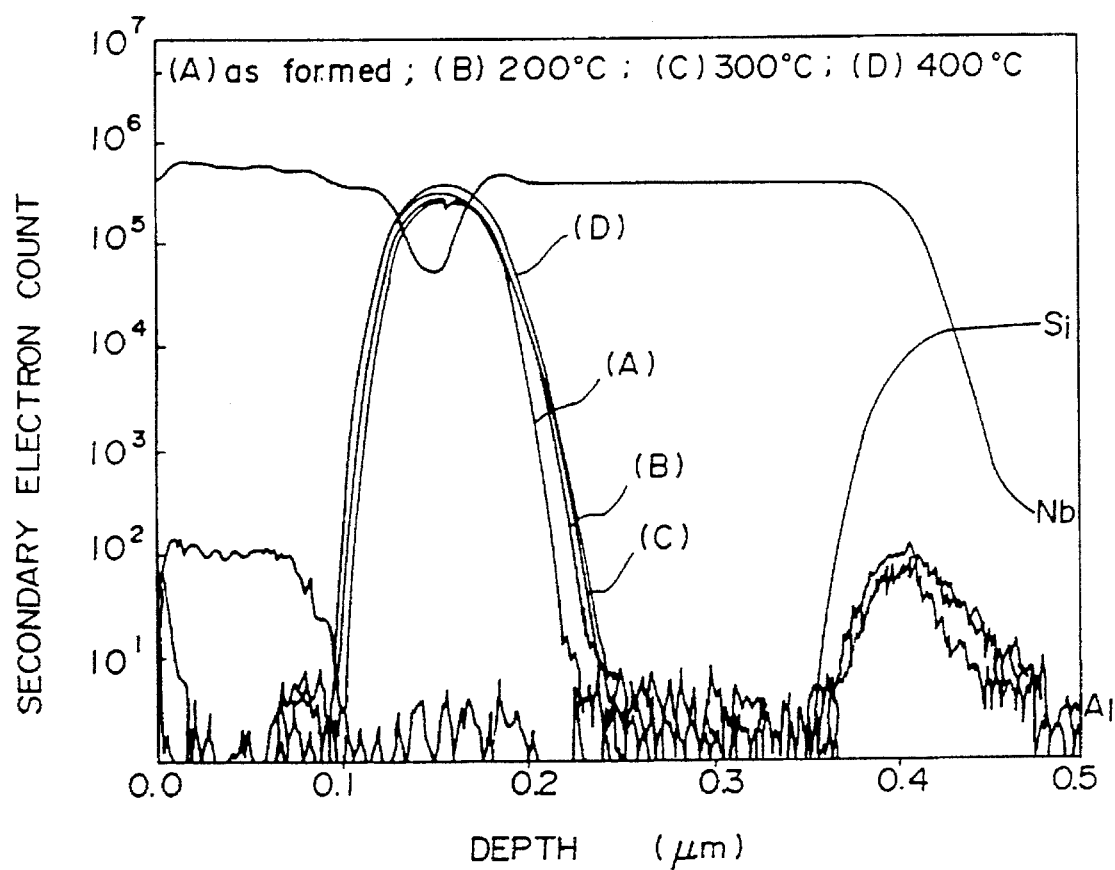
Figure 7A:
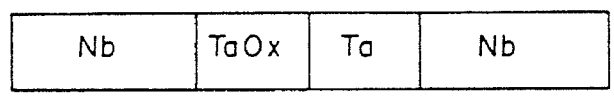
FIGS. 7(A)–7(C) are diagrams respectively showing the structure of another conventional Josephson junction and the distribution profile of elements in the device before a heat treatment and after the heat treatment.
Figure 7B:
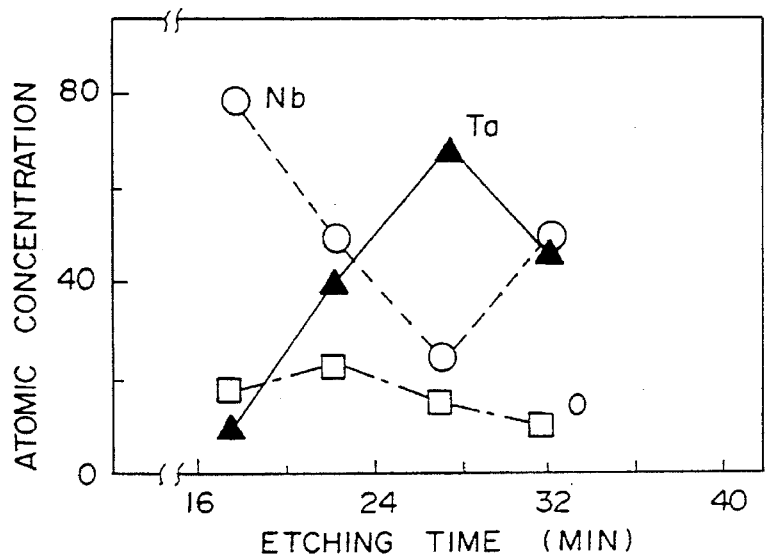
Figure 7C:
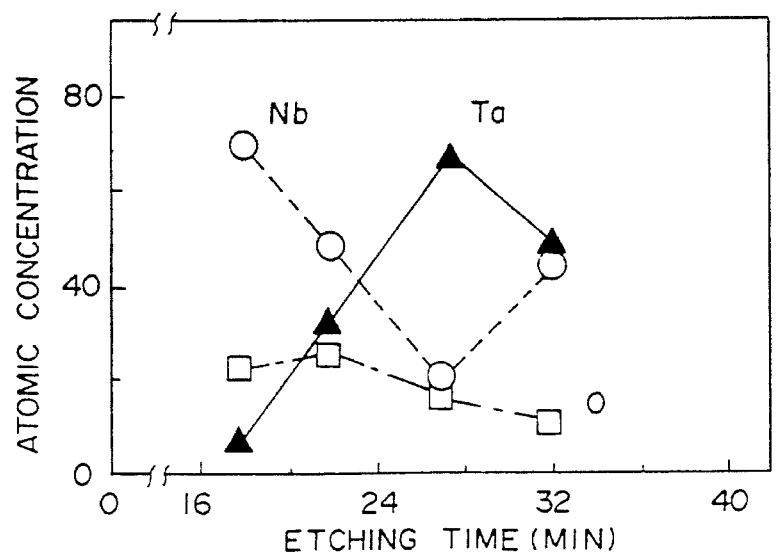
Figure 8A:
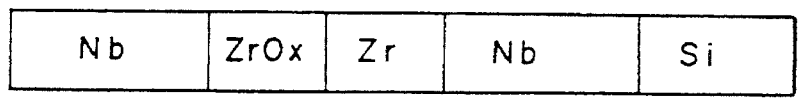
FIG. 8(A) and 8(B) are diagrams respectively showing the structure of still another conventional Josephson junction and the distribution profile of elements in the device structure after a heat treatment at various temperatures.
Figure 8B:
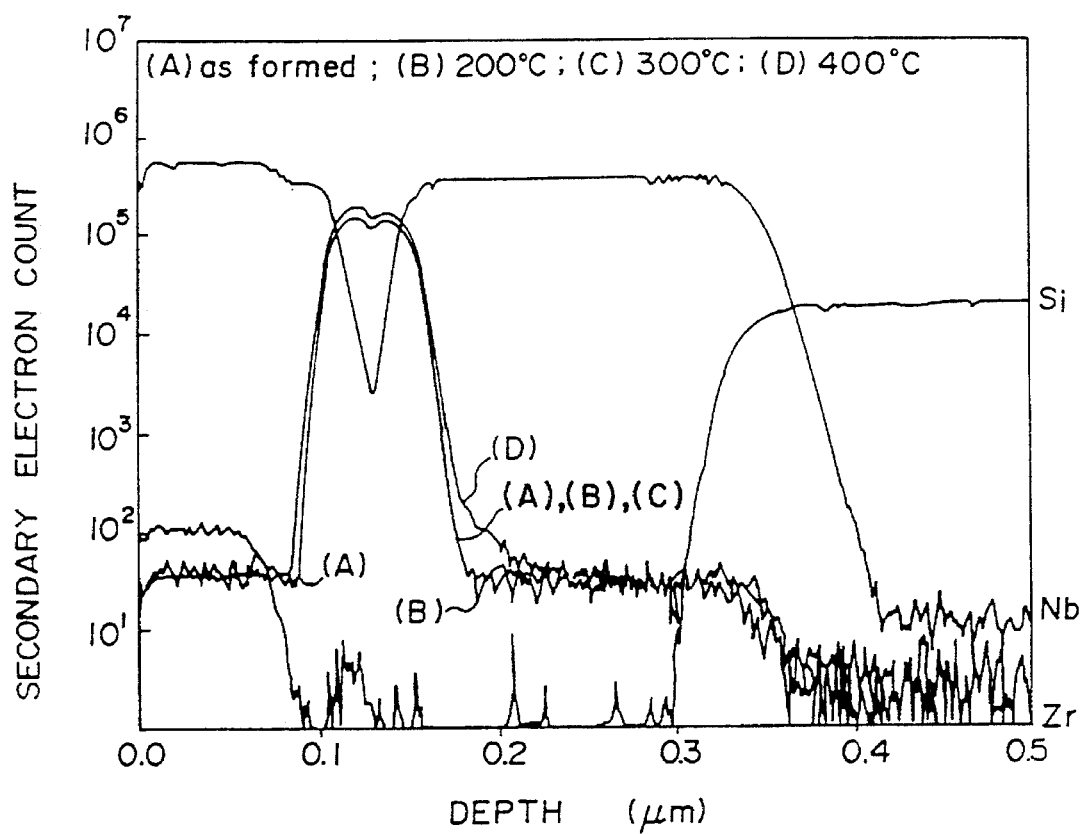
Figure 9A:
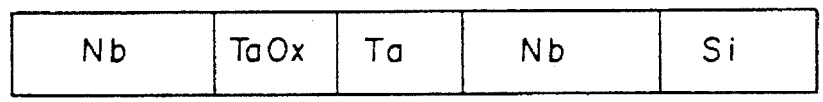
FIGS. 9(A) and 9(B) are diagrams respectively showing the structure of the conventional Josephson junction identical with FIG. 7(A) and the distribution profile of elements in the device structure after a heat treatment at various temperatures.
Figure 9B:
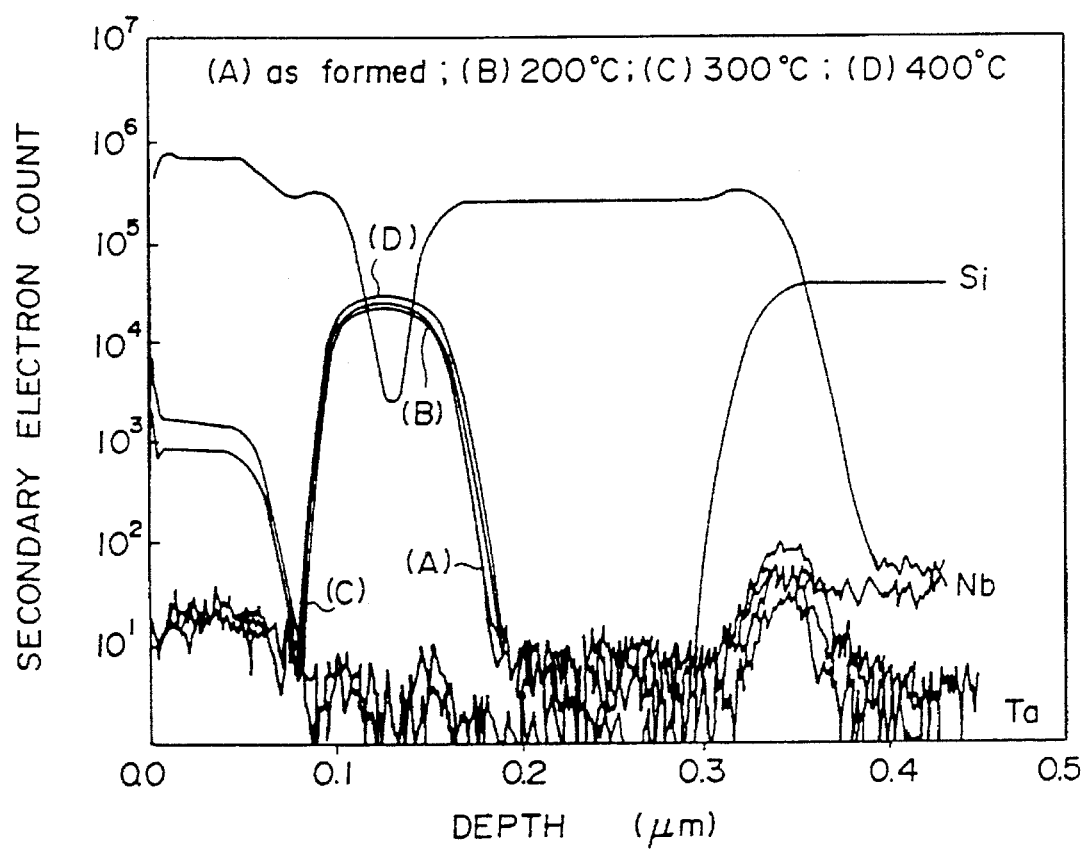
Figure 10A:
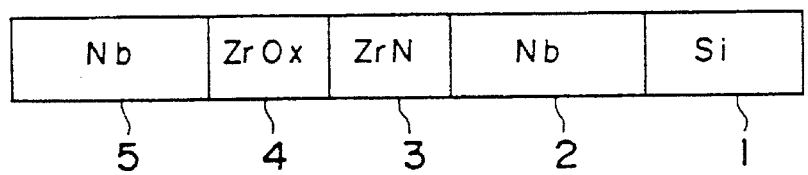
FIGS. 10(A) and 10(B) are diagrams respectively showing the fundamental structure of a Josephson junction according to the present invention wherein ZrN is used for the overlayer and the distribution profile of elements in the device structure after a heat treatment at various temperatures.

First, the principle of the present invention will be described with reference to FIGS. 10(A) and 10(B), wherein FIG. 10(A) shows the fundamental structure of the Josephson junction employed in the Josephson device of the present invention.

Referring to FIG. 10(A), the Josephson junction is formed on a silicon substrate 1, and includes a niobium superconducting electrode 2 provided on the upper major surface of the silicon substrate 1. On the upper major surface of the superconducting electrode 2, on the other hand, there is provided an overlayer 3 of ZrN of a thickness less than the coherent length of the Nb superconducting electrode, and a barrier layer 4 of $ZrO_x$ is formed on the upper major surface of the overlayer 3. As will be described later in detail, the barrier layer 4 is formed by the oxidation of the surface of the ZrN overlayer. On the upper major surface of the barrier layer 4, another superconducting electrode 5 of Nb is provided.

Figure 10B:
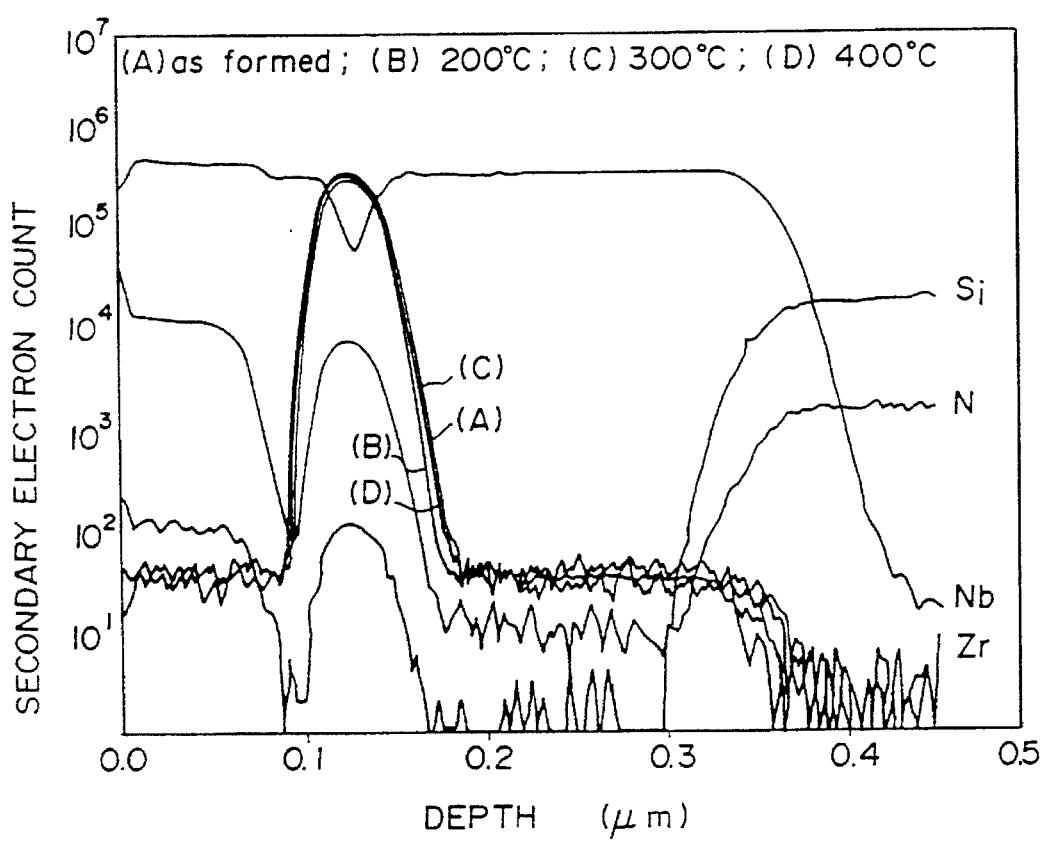

FIG. 10(B) shows the distribution profile of various elements such as zirconium, niobium, nitrogen and silicon in the structure of FIG. 10(A), wherein the curve designated as (A) represents the distribution of zirconium in the as-formed device, the curve (B) represents the result for the device when subjected to treatment at 200° C. for 1 hour, the curve (C) represents the result for the device when subjected to heat treatment at 300° C. for 1 hour, and the curve (D) represents the result for the device when subjected to heat treatment at 400° C. for 1 hour.

Figure 11A:
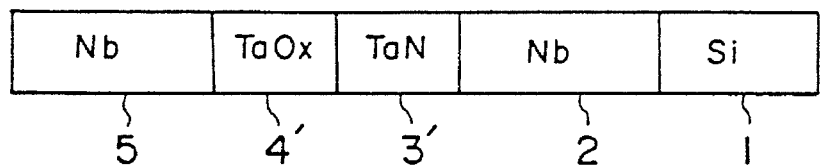
FIGS. 11(A) and 11(B) are diagrams respectively showing the fundamental structure of another Josephson junction according to the present invention wherein TaN is used for the overlayer and the distribution profile of elements in the device structure according to a heat treatment at various temperatures.
Figure 11B:
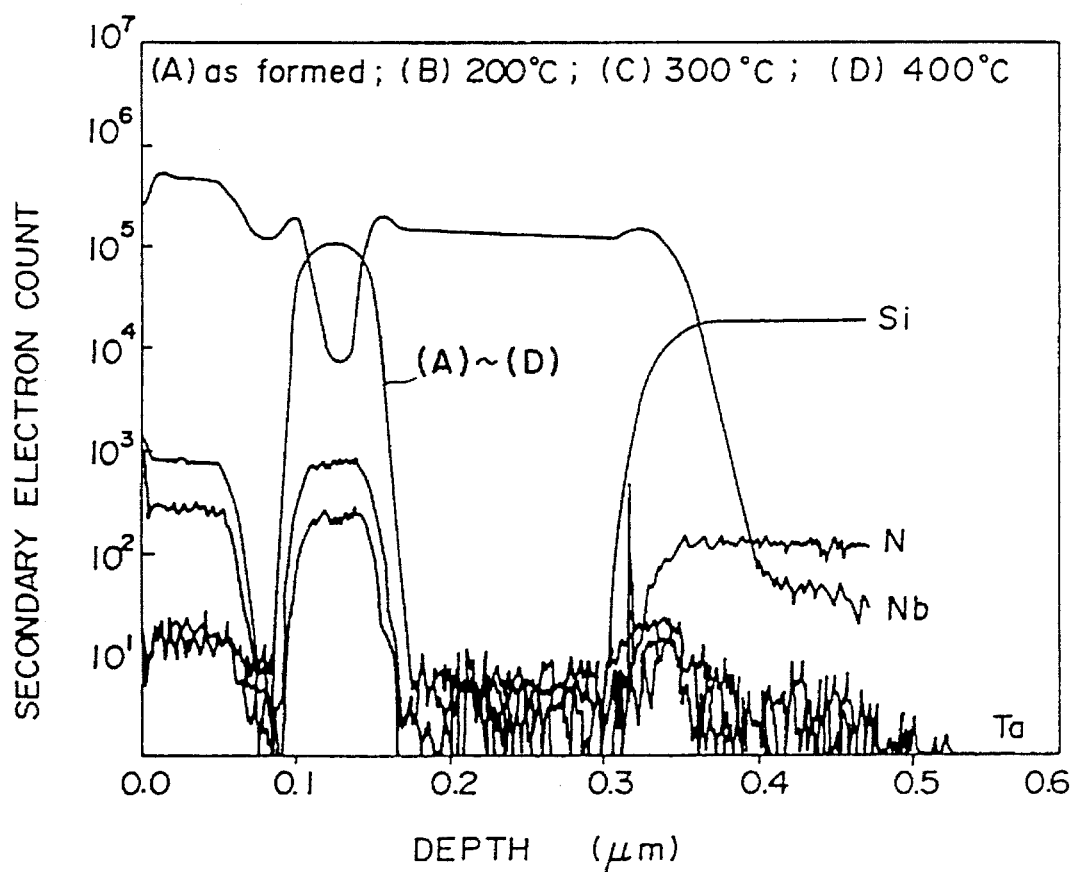

As can be seen in FIG. 10(B), the profile of zirconium changes little even when subjected to heat treatment at 200° C., 300° C. and 400° C. As can be seen the curves (B) and (D) for the temperatures of 200° C. and 400° C., the distribution of zirconium shifts slightly in the direction of the electrode 5. On the other hand, in the curve (C) for the temperature of 300° C., the profile shifts slightly in the opposite direction. From this, it is concluded that the variation in the distribution profile of zirconium by the heat treatment is not material, and there is no substantial change in the composition of the Josephson device having the structure of Nb/ZrN/ZrO$_x$/Nb FIGS. 11(A) and 11(B) shows the case wherein the ZrN overlayer 3 is replaced with another overlayer 3' of TaN. See the structure of FIG. 11(A). It should be noted that, associated with the use of TaN for the overlayer 3', the barrier layer 3 changes now to a barrier layer 3' that has the composition of TaO$_x$.

Referring to FIG. 11(B) showing the distribution profile of tantalum, niobium, nitrogen and silicon in the structure of FIG. 11(A), it will be understood that there is substantially no change in the distribution profile of tantalum even when the heat treatment at 400° C. is applied. In other words, it is shown that a Josephson junction having the structure of Nb/TaN/TaO$_x$/Nb exhibits an excellent durability against the heat treatment that is used in the planarization process.

Further, it was found that use of other nitrides of refractory metals such as HfN, GaN and SiN for the overlayer in combination with corresponding oxide barrier layers such as HfO$_x$, GaO$_x$ and SiO$_x$ provide a similar preferable feature. It is believed, from these results, that the use of nitrides of refractory metals for the overlayer effectively prevents the diffusion of the refractory metals contained in the overlayer as well as in the barrier layer into the Nb superconducting electrodes. Thus, a Josephson junction having a nitride overlayer is expected to show an excellent stability against (i.e., when subjected to) heat treatment. It should be noted that materials such as HfO$_x$, GaO$_x$ and SiO$_x$ that are formed by the oxidation of the upper major surface of the overlayer exhibit an excellent characteristic as the tunnel barrier of the Josephson junction.

Figure 12:
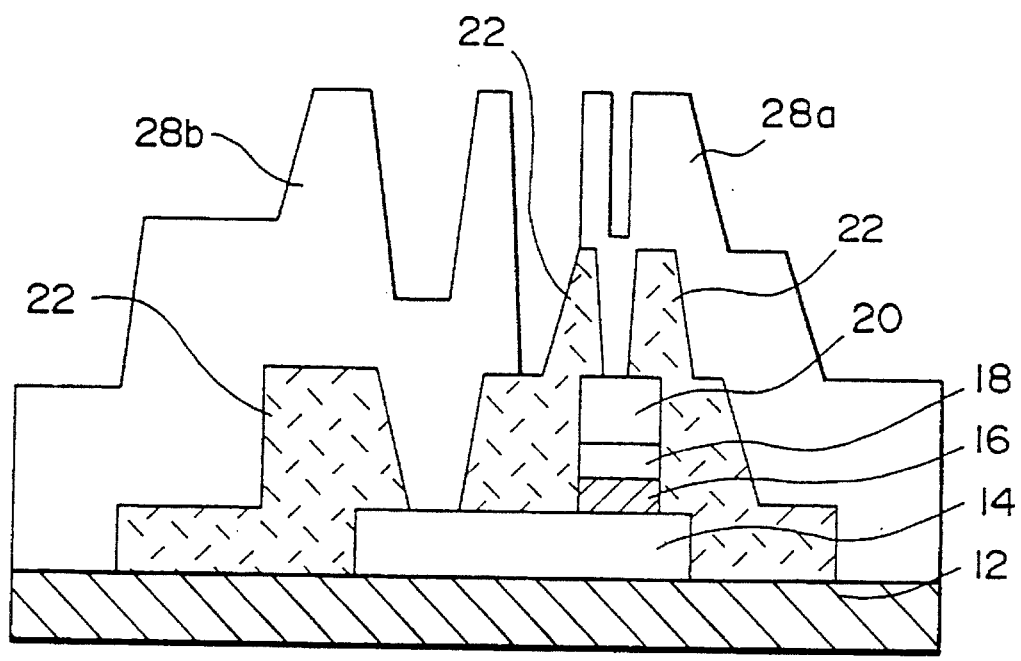
FIG. 12 is a cross sectional view showing a Josephson device according to a first embodiment of the present invention.
Figure 13:
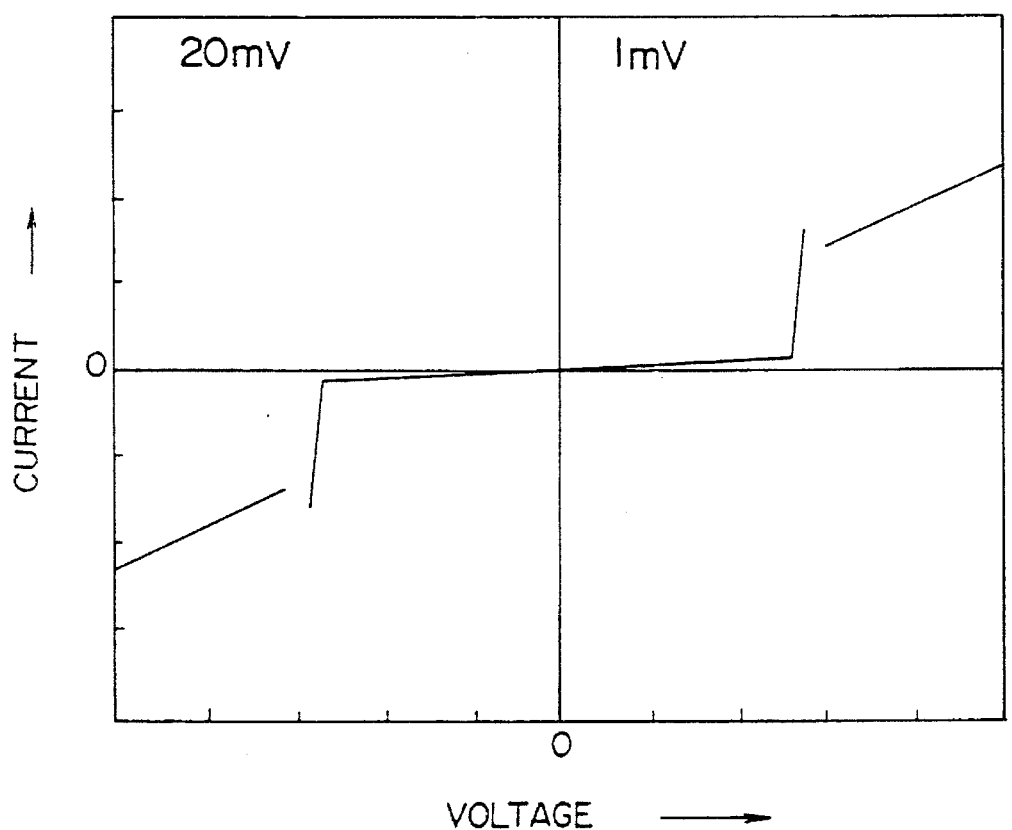
FIG. 13 is a diagram showing a voltage-current characteristic curve of the device of FIG. 12.

Next, a first embodiment of the present invention will be described with reference to FIGS. 12–14, wherein FIG. 12 shows a cross sectional view of the Josephson device according to a first embodiment of present invention.

Referring to FIG. 12, the Josephson device is constructed on a silicon substrate 12 and includes a niobium electrode 14 that is provided on the upper major surface of the substrate 12 in a thickness of about 200 nm. On the upper major surface of the niobium electrode 14, there is provided an overlayer 16 of ZrN in a thickness of 1–10 nm. This thickness is chosen to be smaller than the coherent length in the Nb superconducting electrode 14. As will be noted later, one can form the ZrN layer 16 with such an extremely small thickness by the d.c. magnetron sputtering.

The upper major surface of the ZrN overlayer 16 is subjected to an oxidation process to form a barrier layer 18 of ZrO$_x$ with a thickness of 1–10 nm, depending on the thickness of the overlayer 16. Further a niobium superconducting electrode 20 is provided on the upper major surface of the barrier layer 18 and a Josephson junction having a structure of Nb/ZrN/ZrO$_x$/Nb is formed.

The silicon substrate 12 and the Josephson junction of the Nb/ZrN/ZrO$_x$/Nb structure formed thereon are buried under a silicon oxide insulation layer 22. Thus, the silicon oxide layer 22 covers the lower niobium electrode 14, the ZrN overlayer 16, the ZrO$_x$ barrier layer 18, and the upper niobium electrode 20. The silicon oxide insulation layer 22 in turn is provided with contact holes in correspondence to the lower niobium electrode 14 and the upper niobium electrode 20 for exposing the upper major surface of the electrodes 14 and 20, and there are provided niobium interconnection patterns 28e and 28b respectively in contact with the exposed upper major surface of the electrode 20 and the exposed upper major surface of the electrode 14 via the respective contact holes FIG. 13 shows the voltage-current characteristics of the Josephson device of FIG. 12 after a heat treatment at the temperatures of 200°–400° C. for 1 hour. As can be seen clearly from FIG. 13, there is substantially no difference in the voltage-current characteristics even after the heat treatment. This clearly indicates the excellent durability of the Josephson device of the present invention against heat treatment. Obviously, this preferable result was obtained by the use of ZrN for the overlayer that suppresses the diffusion of zirconium at the boundary between the electrode 14 and the overlayer 16. Similarly, the diffusion of zirconium from the overlayer 16 to the upper electrode 20 via the barrier layer 18 is effectively prevented.

Figure 14:
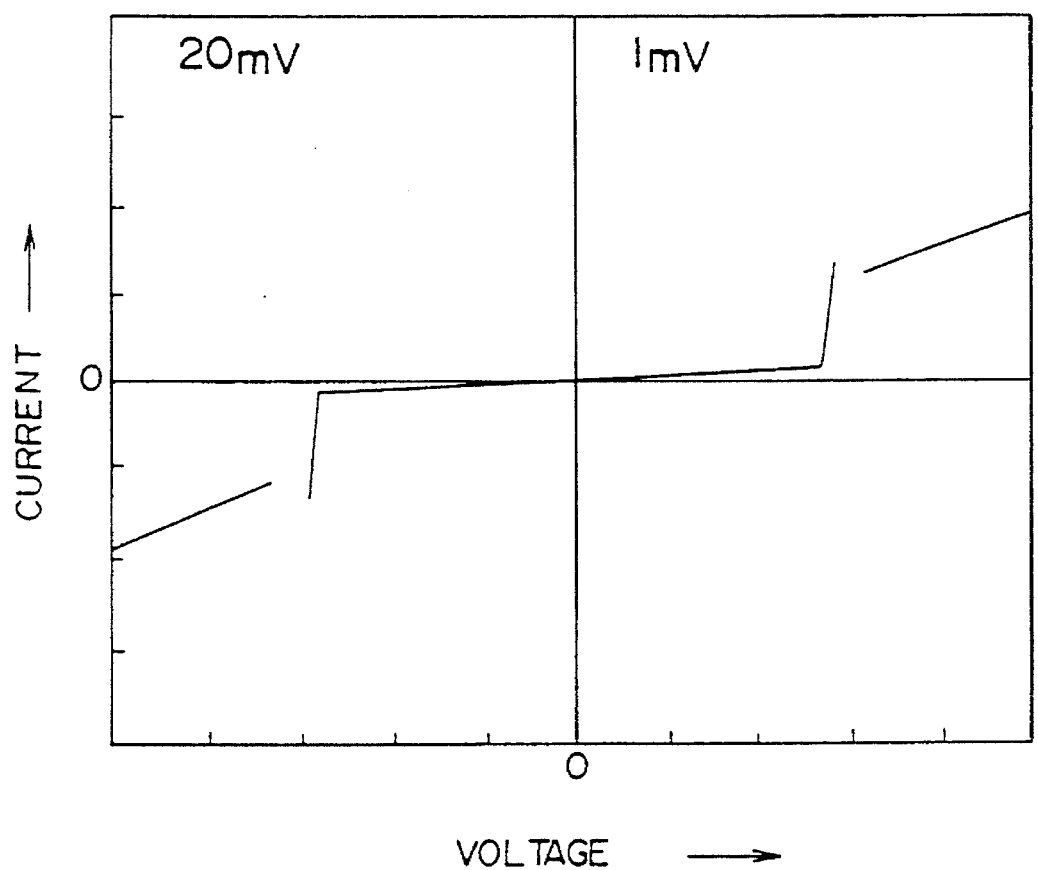
FIG. 14 is a diagram showing a voltage-current characteristic curve of the device of FIG. 12 after a heat treatment.

FIG. 14 shows the voltage-current characteristics of the Josephson device of FIG. 12 except that TaN is used for the overlayer 16. Associated with the use of TaN overlayer 16, the barrier layer 18 is now formed of TaO$_x$. Similar to FIG. 13, FIG. 14 shows the characteristic curve after the heat treatment at 200° C., 300° C. and 400° C. In this case, too, no degradation of the voltage-current characteristic was observed.

Next, the fabrication process of the Josephson device of FIG. 12 will be described with reference to FIGS. 15(A)–15(E).

Figure 15A:
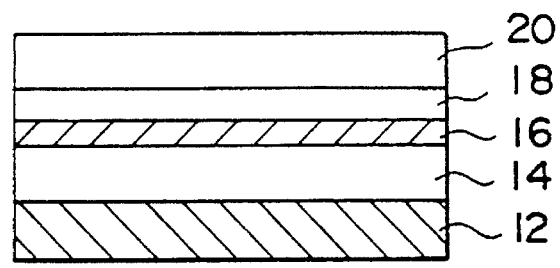
FIGS. 15(A)–15(E) are diagrams showing the process for fabricating the device of FIG. 12.

In the step of FIG. 15(A), the niobium electrode 14 is provided on the silicon substrate 12 by a d.c. magnetron sputtering process with the thickness of 200 nm. The substrate 12 is incorporated into a deposition chamber of the sputtering apparatus, and the sputtering was made under an argon pressure of 1.3 Pa while applying a d.c. current of 2.0 A and a bias voltage of 300 volts. A deposition rate of 200 nm/min is obtained thereby. Of course, materials other than silicon may be used for the substrate 12. Further, the deposition of the electrode 14 may be achieved by the r.f. magnetron sputtering process.

After the niobium electrode 14 is formed, the overlayer 16 of ZrN is deposited consecutively in the same sputtering apparatus by the r.f. magnetron sputtering process, without taking out the substrate 21 thus formed with the electrode 14, out of the deposition chamber. The deposition of the overlayer 16 may be made while flowing a mixture of argon and nitrogen respectively with flow rates of 60 sccm and 3 sccm. During the deposition, an r.f. plasma is formed having an electric power of 2.3 W/cm$^2$. Thereby, a deposition rate of about 2 nm/min is obtained.

After the formation of the overlayer 16, oxygen is introduced into the deposition chamber and an r.f. oxidation process is achieved. Thereby, the upper major surface of the ZrN overlayer 16 is oxidized and the ZrO$_x$ barrier layer 18 is formed. In this process, an electric power of 10–100 W may be employed for establishing the oxygen plasma. The oxidation process may be continued for 1–30 minutes. One may use a mixture of argon and oxygen in place of oxygen.

After the barrier layer 18 is formed, the niobium upper electrode 20 is deposited under the same conditions as the deposition of the lower electrode 14. This process is also carried out in the same sputtering apparatus, without taking out the device out of the deposition chamber. Thereby, a layered body shown in FIG. 15(A) is obtained.

Next, the niobium upper electrode 20 is subjected to a patterning process using a patterned photoresist (not shown) as a mask. More specifically, the mask covers the surface of the niobium upper electrode 20 for a surface area corresponding to the area of the junction that is to be formed. Using the patterned resist as the mask, a reactive ion etching (RIE) process is applied while using a mixture of carbon tetrafluoride ($CF_4$) added with 5% oxygen as the etching gas. The etching is made under the pressure of 9 Pa while flowing the etching gas at a flowrate of 20 sccm and simultaneously applying an r.f. power of 50 W. Thereby, an etching rate of 100 nm/min is obtained. In this RIE process, the overlayer 16 of ZrN or the barrier layer 18 of $ZrO_x$ is less reactive with $CF_4$ in the etching gas than the niobium electrode 20, and because of this, the etching stops generally when the surface of the barrier layer 18 is exposed.

Figure 15B:
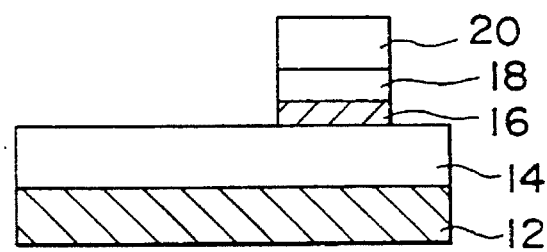

After the niobium upper electrode 20 is thus patterned, a sputter etching is started while using the patterned resist covering the niobium electrode 20 as a mask. In this etching process, the argon gas is supplied at a flowrate of 10 sccm while applying an r.f. power of 300 W. With this process, an etching rate of about 1 nm/min is achieved. After this etching process is completed, the resist on the electrode 20 is removed. Thereby, a structure shown in FIG. 15(B) is obtained.

Next, another photoresist (not shown) is applied on the structure of FIG. 15(B) and patterned subsequently to protect the predetermined region of the electrode 14. Further, an RIE process is applied to remove the Nb that is not protected by the mask. The conditions for this RIE process are identical to those of the RIE process employed for patterning the niobium electrode 20. Thereby, a structure shown in FIG. 15(C) is obtained.

Figure 15C:
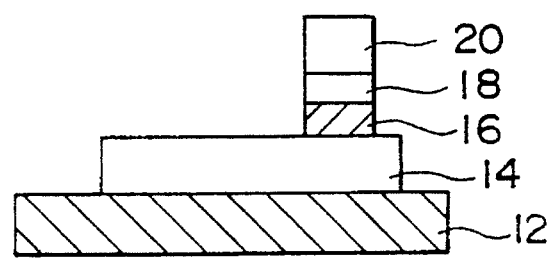

After this process, the silicon oxide insulation layer 22 is deposited on the structure of FIG. 15(C) by a magnetron sputtering process in a thickness of 350 nm. This magnetron sputtering process may for example be achieved under a pressure of 1.3 Pa while flowing the argon gas with the flowrate of 60 sccm and simultaneously applying an r.f. power of 10 W/cm². A deposition rate of about 10 nm/min is obtained thereby. As the present Josephson device has an improved thermal stability, one may use a plasma CVD process conducted at a temperature of about 300° C. for the deposition of the insulation layer 22.

Figure 15D:
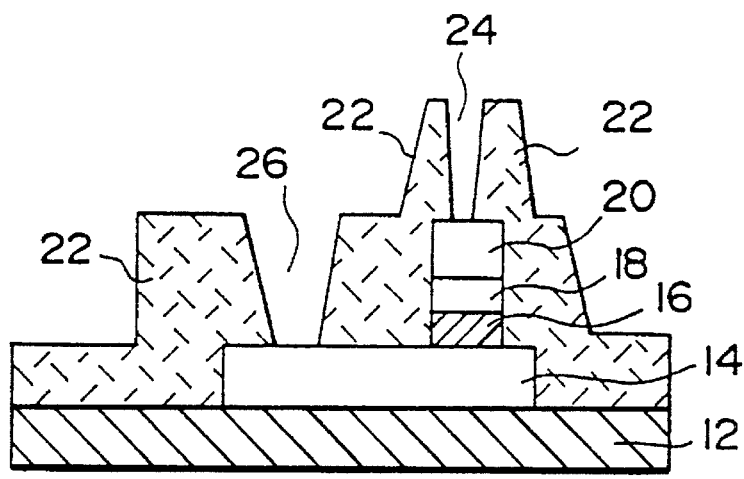
Figure 15E:
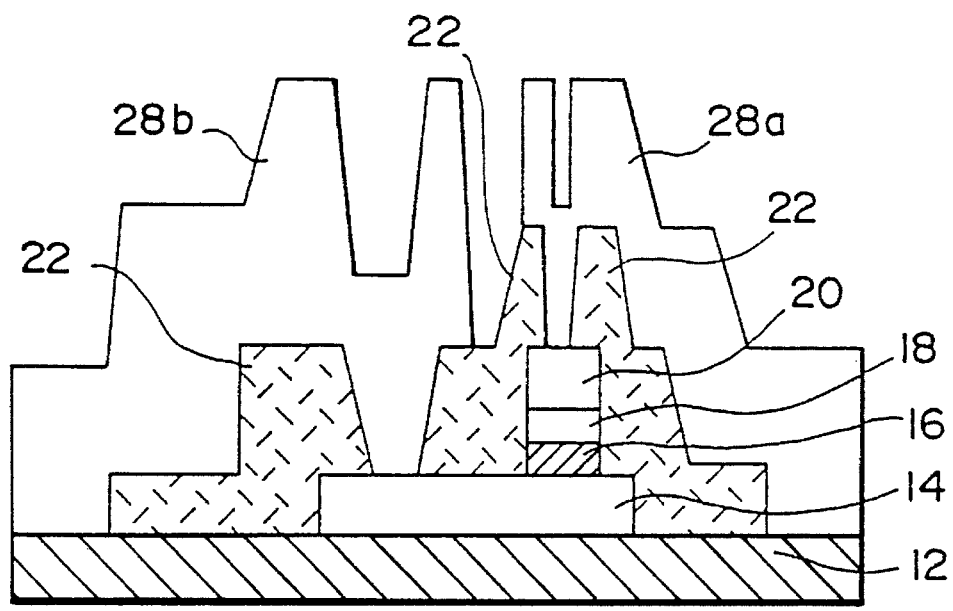

Next, a photoresist (not shown) is applied to the structure of FIG. 15(D) and patterned to expose the silicon oxide layer 22 in correspondence to the region where contact holes are to be formed. After patterning the photoresist, contact holes 24 and 26 are formed in the silicon oxide layer 40a 22 by an RIE process that uses a mixture of $CHF_3$ and 30% oxygen as the etching gas. The etching is conducted under a pressure of 9 Pa while flowing the etching gas with a flowrate of 20 sccm and simultaneously applying an r.f. power of 100 W. Thereby, an etching rate of 30 nm/min is achieved. After removing the photoresist, a structure shown in FIG. 15(D) is obtained. It should be noted that one may use a silicon nitride film in place of the silicon oxide layer 22.

After the upper major surface of the niobium lower electrode 74 and the upper major surface of the niobium upper electrode 20 are exposed via the contact holes 26 and 24 respectively, a niobium layer is deposited by a d.c. magnetron sputtering step, similar to that for the electrodes 14 and 20, in a thickness of 500 nm. After patterning, predetermined interconnection patterns 28a and 28b of niobium are formed respectively in contact with the niobium electrode 14 and the niobium electrode 20 via the contact holes 26 and 24.

Next, a second embodiment of the present invention will be described with reference to FIG. 16.

Figure 16:
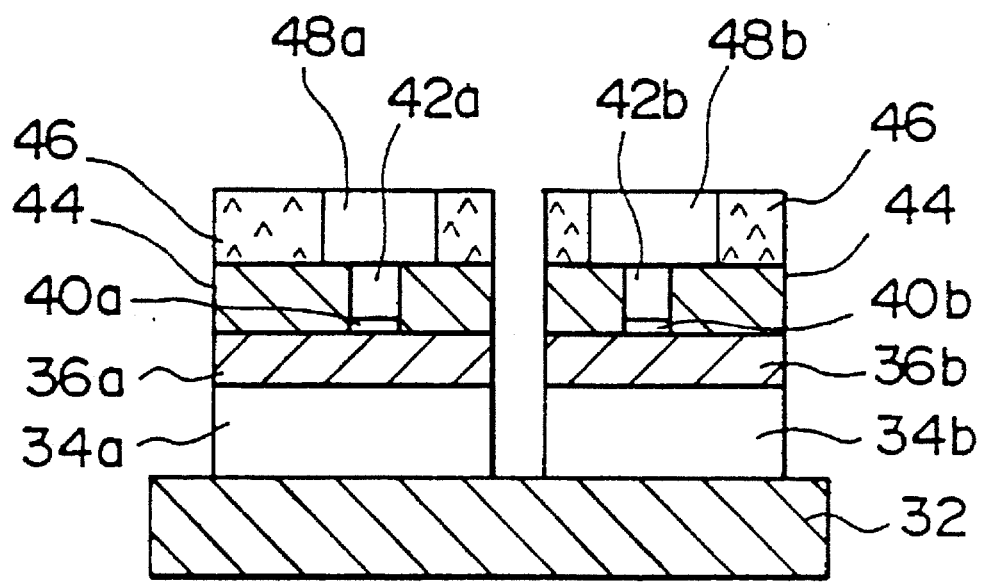
FIG. 16 is a cross sectional view showing a part of a Josephson integrated circuit according to a second embodiment of the present invention.

Referring to FIG. 16, the Josephson device of the present embodiment is constructed on a silicon substrate 32 and includes niobium electrodes 34a and 34b provided on the upper major surface of the silicon substrate 32 with a separation from each other.

On the niobium electrode 34a, there is provided an overlayer 36a of ZrN, and a barrier layer 40a of $ZrO_x$ is formed on the upper major surface of the overlayer 36a. Further, a niobium upper electrode 42a in a thickness of about 200 nm is provided on the upper major surface of the barrier layer 40a. Thereby, a first Josephson junction having the structure Nb/ZrN/$ZrO_x$/Nb is formed.

On the niobium electrode 34b, on the other hand, there is provided an overlayer 36b of ZrN, and a barrier layer 40b of $ZrO_x$ is formed on the upper major surface of the overlayer 36b. Further, a niobium upper electrode 42b in a thickness of about 200 nm is provided on the upper major surface of the barrier layer 40b. In this case, too, a second Josephson junction of the structure Nb/ZrN/$ZrO_x$/Nb is formed. Further, the thickness of the barrier layer 40a and the thickness of the barrier layer 40b are made different from each other. In the present embodiment, it should be noted that the critical current is different in the first Josephson junction and in the second Josephson junction.

Further, it should be noted that a niobium contact layer 48a is provided on the niobium upper electrode 42a and a niobium contact layer 48b is provided on the niobium upper electrode 42b. As can be seen from the illustration, the contact area provided by the contact layers 48a and 48b is substantially larger than the area of the junction itself. In other words, the construction of FIG. 16 is suitable for reducing the area of the Josephson junction in the future Josephson devices.

In the structure of FIG. 16, the first and second Josephson junctions are laterally surrounded by insulation regions 44 of $Nb_2O_5$. Further, the niobium contact electrodes 48a and 48b are laterally surrounded by insulation regions 46 also of $Nb_2O_5$. Furthermore, the entire structure of FIG. 16 is covered by a silicon oxide layer (not shown) having a thickness of 350 nm, and a niobium superconducting interconnection pattern is provided on the silicon oxide layer in a thickness of 500 nm and in contact with the contact electrodes 48a and 48b via contact holes provided in the silicon oxide layer.

Thus, the present embodiment provides the Josephson device wherein a plurality of Josephson junctions are provided with respectively different barrier thicknesses and hence different critical currents. The number of Josephson junctions provided on the common substrate is of course not limited to two but three or more Josephson junctions may also be provided.

Next, the process for fabricating the Josephson device of FIG. 16 will be described with reference to FIGS. 17(A)–17(F).

Figure 17A:
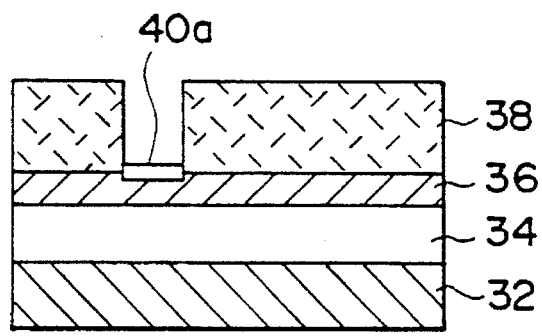
FIGS. 17(A)–17(F) are diagrams showing the fabrication process of the device of FIG. 16.

In the step of FIG. 17(A), a niobium layer forming the electrode 34 and a ZrN layer forming the barrier layer 36 are deposited consecutively on the silicon substrate 32. In FIG. 17(A), the niobium layer is designated by the numeral 34 and the ZrN layer is designated by the numeral 36.

After the ZrN layer 36 is deposited, the layered structure thus obtained is once taken out from the deposition chamber. As the ZrN layer 36 is stable against oxidation, contrary to metal zirconium that is easily oxidized by the natural oxidation process, the surface of the ZrN layer 36 remains unoxidized. Next, a photoresist 38 is deposited on the ZrN layer 36 and patterned to expose the upper major surface of the ZrN layer 36 in correspondence to where the barrier layer 40a is to be formed.

Next, the layered body thus provided with the patterned photoresist 38 is returned to the chamber of the sputtering apparatus and subjected to an r.f. oxidation process while using the patterned photoresist 38 as the mask. The condition of the r.f. oxidation may be the same as described previously. In response thereto, a $ZrO_x$ region acting as the barrier layer 40a is formed on the exposed upper major surface of the ZrN layer 36 in a first thickness. Preferably, the area of the $ZrO_x$ region is set slightly larger than the area of the barrier layer 40a in the completed device of FIG. 16. In FIG. 16, the $ZrO_x$ region is designated by the reference numeral 40a in correspondence to the barrier layer 40a.

Figure 17B:
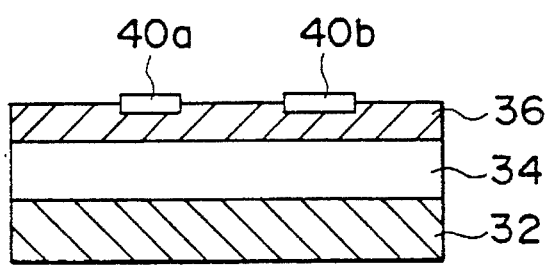

After the $ZrO_x$ region 40a is formed as shown in FIG. 17(A), the device is taken out from the deposition chamber and the photoresist 38 is removed. Further, another photoresist is provided to cover the entire surface of the ZrN layer 36 including the $ZrO_x$ barrier layer 40a thus formed. After patterning the second photoresist to expose the surface of the ZrN layer 36 in correspondence to where the barrier layer 40b is to be formed, the device is returned to the sputtering apparatus wherein the exposed surface of the ZrN layer is subjected to the r.f. oxidation process similarly as before. In response thereto, a $ZrO_x$ region acting as the barrier layer 40b is formed as shown in FIG. 17(B) with a second thickness. In FIG. 17(B), too, the $ZrO_x$ region is designated by the reference numeral 40b in correspondence to the barrier layer 40b.

Figure 17C:
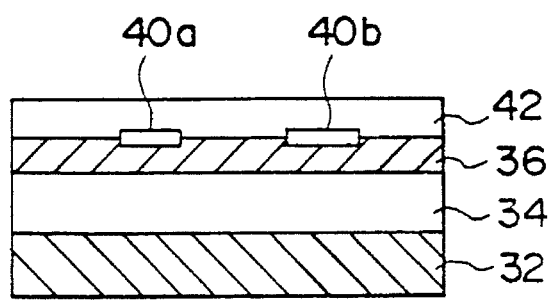

After removing the photoresist, a niobium layer 42 is deposited on the structure of FIG. 17(B) uniformly with a thickness of about 30 nm as shown in FIG. 17(C). Further, after protecting the upper major surface of the Nb layer 42 in correspondence to the Nb contact layers 48a and 48b of FIG. 16 by a photoresist (not shown), the exposed part of the layer 42 is subjected to an r.f. oxidation process to convert the part of the layer 42 not protected by the photoresist into $Nb_2O_5$. Thereby, the oxide regions 44 are formed at both sides of the niobium upper electrodes 42a and 42b. See FIG. 17(D). It should be noted that the effective area of the first Josephson junction is determined by this patterning and oxidation process.

Figure 17D:
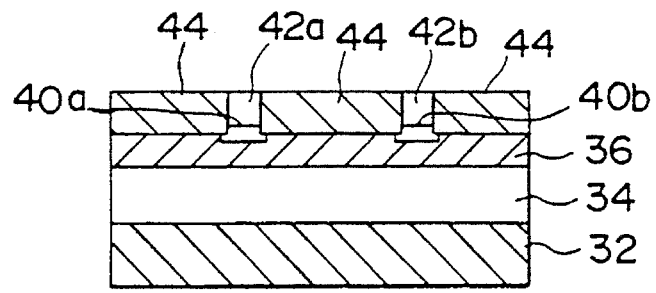
Figure 17E:
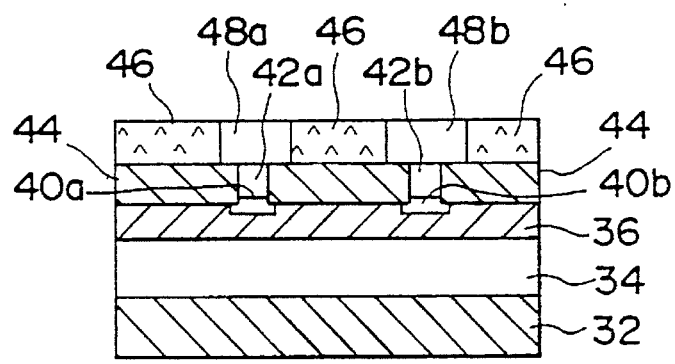

Next, another niobium layer (not shown) is deposited on the structure of FIG. 17(D) with a thickness of about 30 nm. Further, a photoresist (not shown) is deposited on the niobium layer thus deposited and patterned to protect a part of the niobium layer that corresponds to the contact electrodes 48a and 48b of FIG. 16. Next, the niobium layer is subjected to the r.f. oxidation process except for those parts that are protected by the patterned photoresist. Thereby, the insulation regions 46 are formed at both sides of the contact electrodes 48a and 48b. As already noted, the area of the contact electrodes 48a and 48b is not related to the effective area of the Josephson junction and can be chosen as desired. Thus, the present structure allows a reduction of the effective area of the Josephson junction in the future Josephson devices and integrated circuits. After this, the photoresist is removed and the first and second Josephson junctions are separated from each other by an RIE process, proceeding through the $Nb_2O_5$ regions 46 and 44 as well as through the ZrN layer 36 and the Nb layer 34. For example, this etching may be achieved by using a mixture of $CCl_2$ and oxygen as an etching gas. Typically, the etching may be made while flowing the etching gas with a flow rate of 40 sccm for $CCl_2$ and 5 sccm for oxygen, under a pressure of 3 Pa. An r.f. power of about 500 W may be used. Thereby, the structure of FIG. 17(F) is obtained wherein the lower niobium electrode is separated into the electrode 34a and the electrode 34b.

The formation of the contact electrodes 48a and 48b is not limited to the selective oxidation of the region 46 as described but may be achieved by a selective etching of the niobium layer that leaves the contact electrodes 48a and 48b.

Figure 17F:
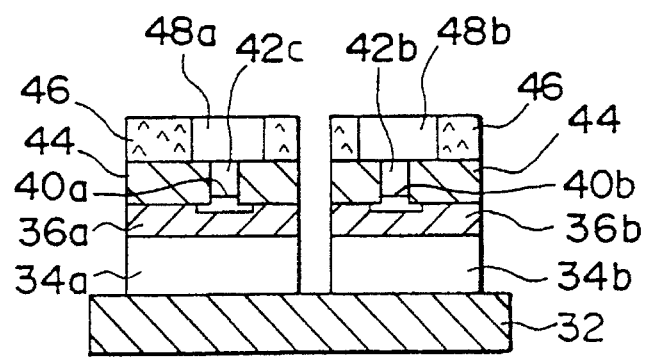

After the structure of FIG. 17(F) is completed, a niobium interconnection layer (not shown) is deposited on the structure of FIG. 17(F) with a thickness of about 500 nm and patterned subsequently.

In the process described heretofore, the first thickness for the first barrier layer 40a and the second thickness for the second barrier layer 40b can be made different without difficulty. In other words, one can form two or more Josephson junctions on a common substrate with respective critical current levels that differ from each other.

Next, a third embodiment of the present invention will be described with reference to FIGS. 18(A)–18(D).

Figure 18A:
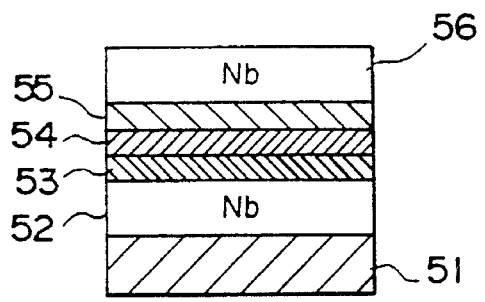
FIGS. 18(A)–18(G) are diagrams showing the fabrication process of the Josephson device according to a third embodiment of the present invention.

Referring to FIG. 18(A), the present embodiment has a structure that may be schematically represented as Nb/HfN/Hf/HfO$_x$/Nb. More specifically, the Josephson device is constructed on a silicon substrate 51 and includes a niobium electrode 52 that is deposited on the upper major surface of the silicon substrate 51 by a d.c. magnetron sputtering process with a thickness of 200 nm. The sputtering may be achieved for example under the pressure of argon of 1.3 Pa while supplying a current of 2.0 A and a voltage of 300 V. Thereby, a deposition rate of 30 nm/min can be achieved.

On the upper major surface of the niobium electrode 52, an overlayer 53 of HfN is provided by an r.f. magnetron sputtering process with a thickness of 2 nm. The deposition may be achieved for example under the argon partial pressure of 2 Pa and the nitrogen partial pressure of 0.2 Pa while applying an r.f. power of 400 W. In this condition, a deposition rate of 30 nm/min can be achieved.

On the upper major surface of the overlayer 53, another overlayer layer 54 of hafnium is deposited by a d.c. magnetron sputtering process for a thickness of 2 nm under the argon pressure of 1.3 Pa while supplying the current of 1.0 A and the voltage of 300 V. In this deposition condition, a deposition rate of 10 nm/min is achieved. The total thickness of the layers 53 and 54 is set within 10 nm.

After the second overlayer 54 is formed, the surface of the layer 54 is oxidized by introducing oxygen. Typically, the oxidation is achieved under the oxygen partial pressure of 133 Pa for 30 minutes by a thermal oxidation process and a barrier layer 55 of HfO$_x$ is formed in response thereto. Further, a niobium upper electrode 56 is provided on the barrier layer 55 by the d.c. magnetron sputtering process in a thickness of 200 nm, similar to the niobium electrode 52.

Figure 18B:
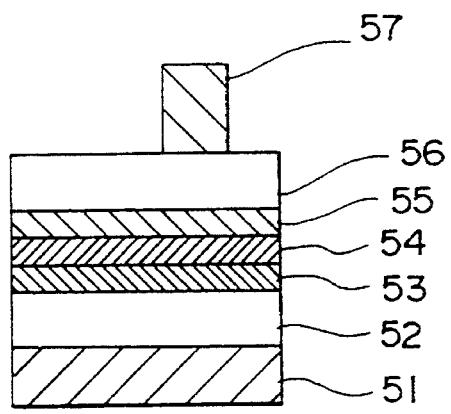
Figure 18C:
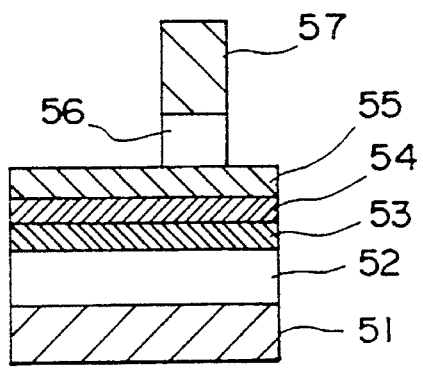

In the step of FIG. 18(B), a photoresist 57 is deposited on the upper major surface of the niobium upper electrode 56 and patterned. Further, while using the patterned photoresist 57 as the mask, the niobium layer 56 is subjected to the RIE process using a mixture of $CF_4$ and oxygen as the etching gas. In this RIE process, the niobium layer 56 is selectively etched while the underlying HfO$_x$ barrier layer 55 and the Hf layer 54, located further below the barrier layer 55, are not etched. In other words, the etching stops at the layer 55. FIG. 18(C) shows the state when the RIE process has stopped.

Figure 18D:
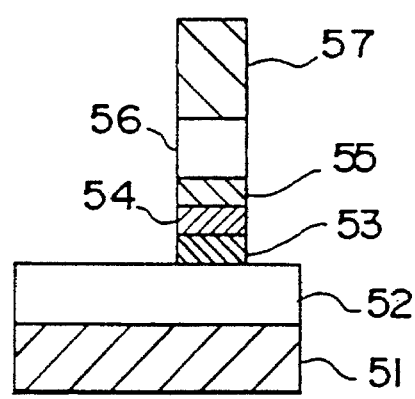

Next, an ion beam etching process is employed to pattern the exposed HfO$_x$ barrier layer 55 while using the photoresist 57 as the mask. The ion beam etching process is continued until the upper major surface of the niobium layer 52 is exposed as shown in FIG. 18(D). This ion beam etching may be achieved under the argon pressure of 0.1 Pa and the acceleration voltage of 150 V. Thereby, one obtains an etching rate of about 10 nm/min.

Figure 18E:
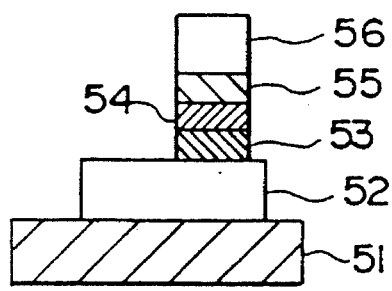

In the next step of FIG. 18(E), the photoresist 57 is removed and the lower niobium electrode 52 is patterned according to the usual photolithographic process.

Figure 18F:
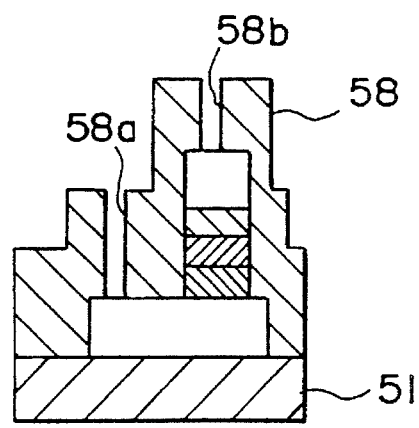

Next, in the step of FIG. 18(F), a silicon oxide insulation layer 58 is deposited on the entire structure of FIG. 18(E) in a thickness of 400 nm. The deposition may for example be achieved by an r.f. magnetron sputtering process under an argon pressure of 1.3 Pa and the supplied power of 900 W. Thereby, a deposition rate of about 8 nm/min is obtained.

After the deposition, contact holes 58a and 58b are formed on the insulation layer 58 respectively in correspondence to the niobium lower electrode 52 and the niobium upper electrode 56 to expose the upper major surface thereof. This RIE process may be achieved by using a mixture of $CHF_3$ and oxygen as the etching gas. The etching may be conducted under the pressure of 4 Pa while applying the power of 100 W. Thereby, an etching rate of 30 nm/min can be achieved.

Figure 18G:
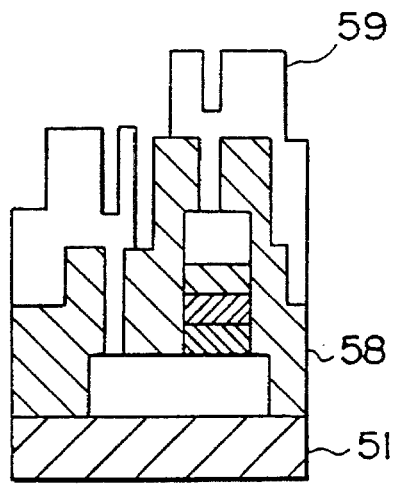

Further, in the step of FIG. 18(G), a niobium layer 59 is deposited on the silicon oxide insulation layer 58 in a thickness of 600 nm and in contact with the upper and lower niobium electrodes via the contact holes 58a and 58b. Further, by patterning the niobium layer 59, the Josephson device of the present embodiment is completed.

In the present embodiment, the barrier layer 55 of $HfO_x$ is formed by the thermal oxidation of the surface of the second overlayer 54 of hafnium. Thereby, the first overlayer 53 of HfN remains intact and the Josephson device of the present embodiment shows a voltage-current characteristic that is superior to any of the embodiments described heretofore or which will be described hereinafter. It should be noted that, in the conventional embodiments where the nitride overlayer is subjected to the r.f. oxidation process, the oxide barrier layer is formed as a result of equilibrium of the etching and oxidation caused by the r.f. discharge under the presence of oxygen. In such an r.f. oxidation process, the thin nitride overlayer, that typically is of the thickness of a few nanometers, may be etched excessively.

In the present embodiment, the Josephson device is characterized by the barrier layer 55 that is formed by the thermal oxidation process, the nitride overlayer 53 that acts as the diffusion barrier, and the layers 54 and 55 that act as the etching stopper. Thereby, one can stop the etching of the upper niobium electrode 56 in the step of FIG. 18(C) with absolute reliability and the fabrication of the Josephson devices becomes easier. It should be noted that the metal overlayer 55 of the present embodiment is not limited to hafnium as described, but zirconium may also be used. In this case, one uses ZrN for the overlayer 53 and $ZrO_x$ for the barrier layer 55.

Next, a fourth embodiment of the present invention will be described with reference to FIGS. 19(A)–19(F). This embodiment is intended to use a superconducting material having a high critical temperature for the electrode of the Josephson junction. The Josephson device itself has a structure similar to the device of the first embodiment.

Figure 19A:
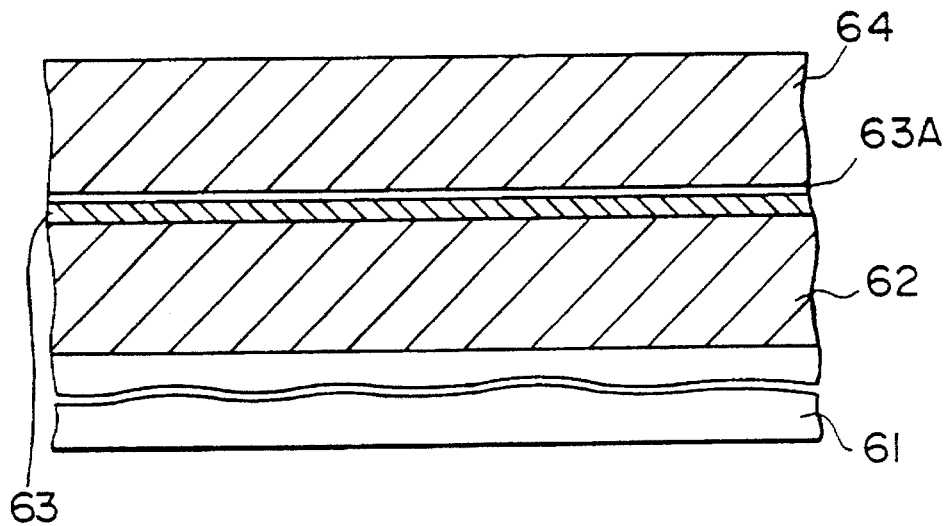
FIGS. 19(A)–19(F) are diagrams showing the fabrication process of the Josephson device according to a fourth embodiment of the present invention.
Figure 19B:
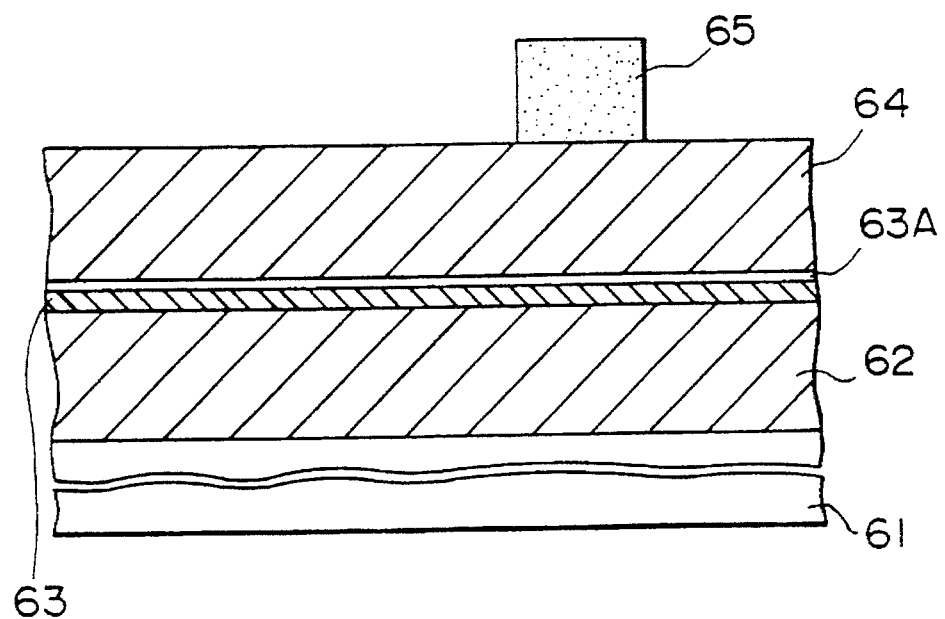

Referring to FIG. 19(A), a lower electrode layer 62 of NbN is deposited on the upper major surface of a silicon substrate 61 by an r.f. magnetron sputtering. The sputtering may be achieved as follows.

r.f. power: 1 KW
gas: mixture of Ar and $O_2$ with a ratio 5:1
gas flow rate: 30 sccm
target: Nb
deposition rate: about 100 nm/min
thickness: about 150 nm The deposition of niobium layer 62 is of course not limited to the r.f. magnetron sputtering described above but other processes such as ion beam sputtering or d.c. magnetron sputtering processes may be employed.

Next, the target is replaced with tantalum, and the r.f. magnetron sputtering process is applied in the same condition as above. Thereby, an overlayer 63 of TaN is grown on the NbN electrode layer 62 with a thickness of 1–5 nm. Alternatively, a target of zirconium may be used in this step. In this case, a ZrN layer is obtained as the overlayer 63.

Next, oxygen is introduced into the deposition chamber of the sputtering apparatus, and the surface of the TaN overlayer 63 is oxidized by an r.f. oxidation process to form a barrier layer 63A of $TaO_x$. When ZrN is used for the overlayer 63, the barrier layer 63A has the composition of $ZrO_x$. The conditions of the r.f. oxidation process employed for forming the barrier layer 63A are as follows:

gas: mixture of Ar and $O_2$ (10%)
pressure: 1.3 Pa
r.f. power: 50 W
duration: 2–3 min It should be noted that the critical current of the Josephson junction depends on the thickness of the barrier layer 63A that in turn can be controlled in response to the oxygen concentration, gas pressure, r.f. power, and duration of the oxidation.

Next, an upper electrode 64 of NbN is provided on the barrier layer 63A according to the same process for forming the lower electrode layer 64.

After the electrode layer 64 is formed, the structure obtained is removed from the deposition chamber of the sputtering apparatus, and a photoresist is applied to cover the upper major surface of the NbN upper electrode layer 64. Further, the photoresist is patterned to form a photoresist pattern 65 that covers the upper major surface of the layer 64 in correspondence to the Josephson junction to be formed. See FIG. 19(B). It should be noted that the photoresist pattern 65 determines the area of the Josephson junction to be formed in the device.

Figure 19C:
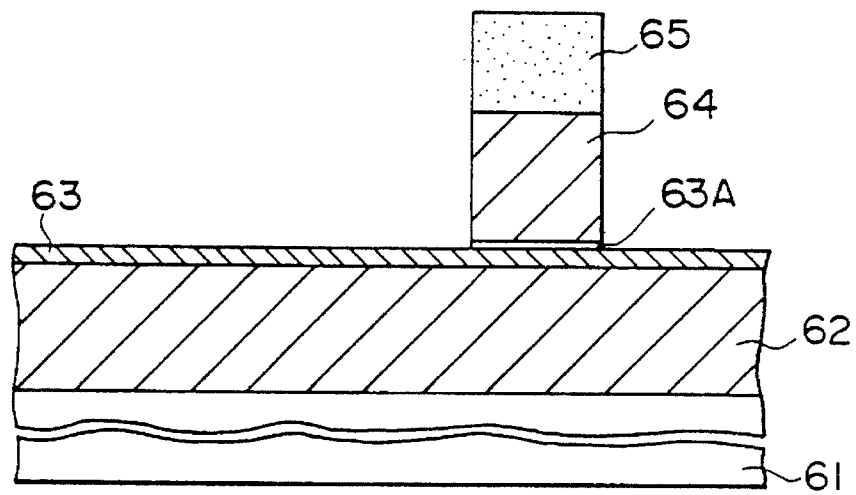

Next, in the step of FIG. 19(C), the exposed NbN upper electrode 64 is subjected to an RIE process while using the photoresist pattern 65 as a mask, until the unprotected NbN layer 64 is removed. The etching stops at the upper major surface of the TaN barrier layer 63. The RIE process may be conducted according to the conditions, as follow:

gas: mixture of $CF_4+O_2$ (5%)
gas flow rate: 50 sccm
pressure: 10 Pa
r.f. power: 50 W
etching rate: 200 nm/min After the above process, the photoresist pattern 65 is removed, and the patterning of the lower NbN electrode layer 62 including the overlayer 63 thereon is achieved by the RIE process. The condition of the RIE process for patterning the NbN electrode 62 is as follow:

gas: Ar
gas flow rate: 10 sccm
pressure: 0.5 Pa
r.f. power: 100 W
etching rate: 3 nm/min The above conditions are applicable also for the case when ZrN is used for the overlayer 63. The above patterning of the lower NbN electrode 62 and the overlayer 63 thereon is of course conducted while protecting the part not to be etched by providing a patterned photoresist. After the structure of FIG. 19(D) is obtained, the photoresist is removed.

Figure 19D:
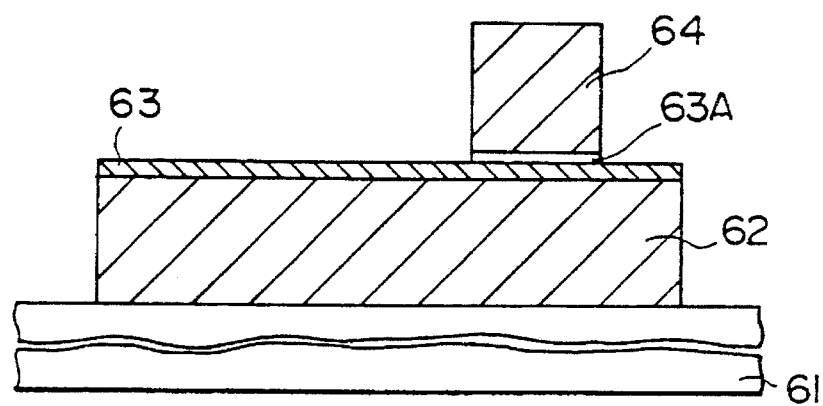

On the structure of FIG. 19(D), a silicon oxide insulation layer 66 is deposited by an r.f. magnetron sputtering process. The conditions for this process may be as follows.

r.f. power: 1 kW
gas: Ar
gas flowrate: 50 sccm
target: $SiO_2$
deposition rate: about 8 nm/min
thickness: about 400 nm Further, by applying a photolithographic process in combination with an RIE process, contact holes 66A and 66B are formed on the insulation layer 66 to expose the upper major surface of the NbN electrode 62 the NbN electrode 64, respectively. The RIE process may for example be conducted according to the following conditions:

(A) for $SiO_2$ layer 66
  gas: $CHF_3+O_2$ (10%)
  r.f. power: 100 W
  etching rate: 30 nm/min (B) for TaN overlayer 63
  gas: Ar
  gas flow rate: 10 sccm
  pressure: 0.5 Pa
  r.f. power: 100 W
  etching rate: 3 nm/min In response to the RIE etching above, the contact hole 66A exposes the upper major surface of the NbN electrode 62 while the contact hole 66B exposes the upper major surface of the NbN electrode 64.

Figure 19E:
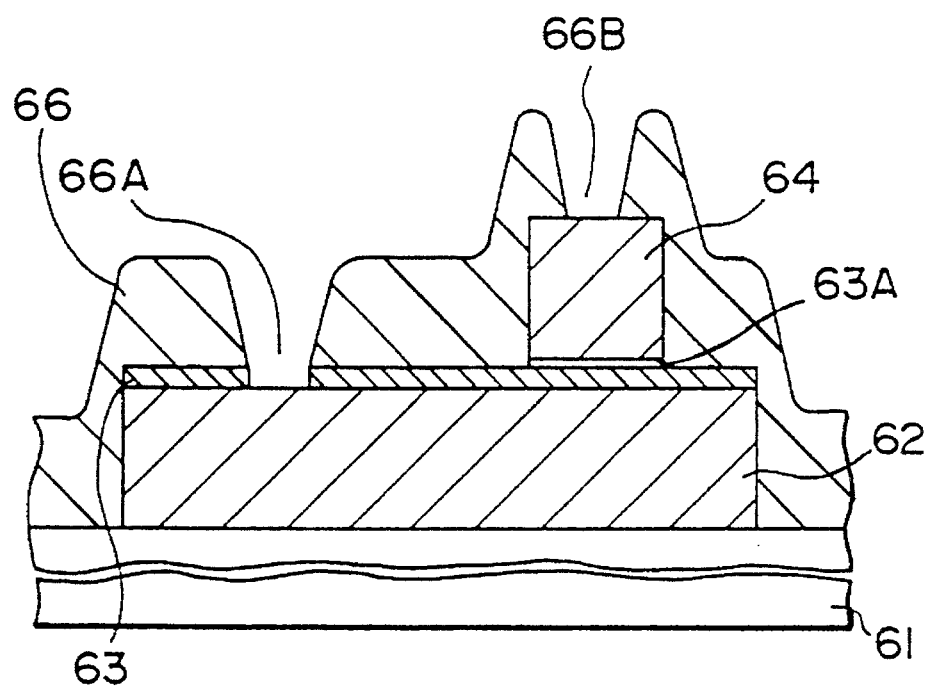

On the structure of FIG. 19(E), an NbN layer (not shown) is deposited in a thickness of about 500 nm by the process similar to the one used for depositing the NbN electrode 62 or 64. Further, after patterning the NbN layer, an NbN interconnection pattern 67 and an NbN pattern 68 are formed respectively in contact with the electrode 62 and the electrode 64. After removing the remaining photoresist, the Josephson device shown in FIG. 19(F) is completed.

Figure 19F:
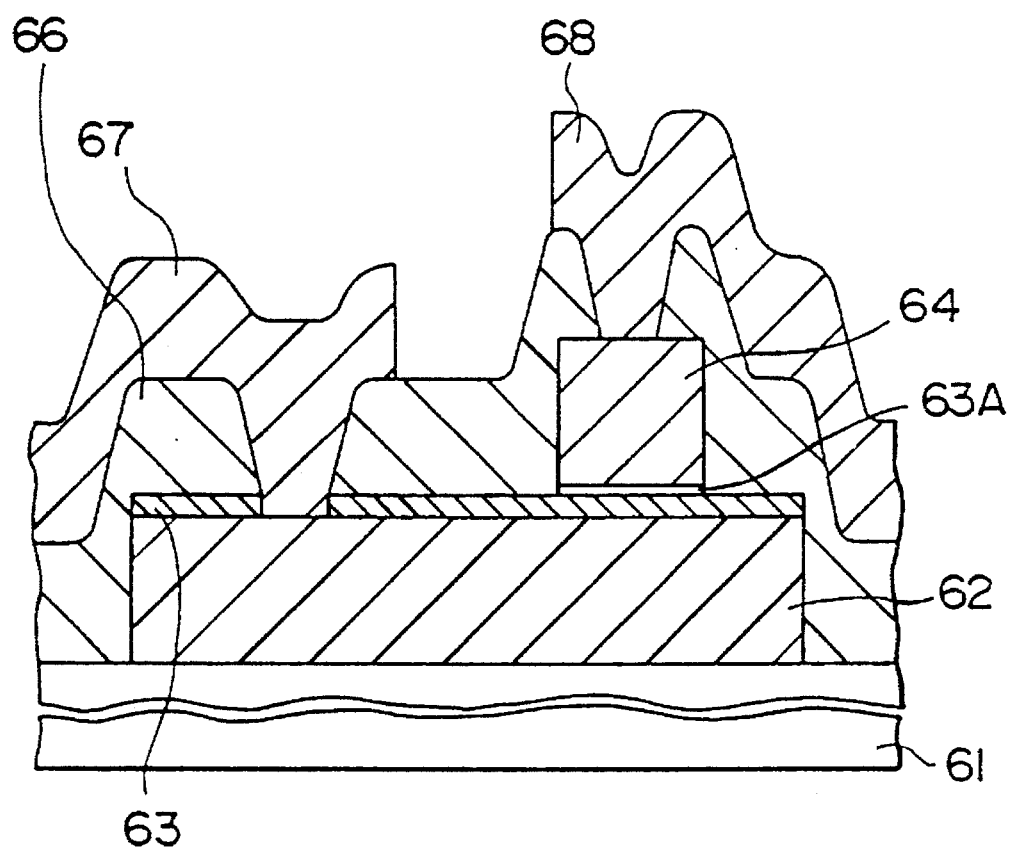

The device of FIG. 19(F) has an advantageous feature, due to the high critical temperature of superconduction transition of the NbN electrodes 62 and 64, that the device can be operated at relatively high temperatures such as 10 K. It should be noted that NbN has a critical temperature Tc of 16 K. Thereby, one can simplify the cooling system for maintaining the Josephson device in the low temperature environment. When the Josephson device having such a high critical temperature is operated in the liquid helium temperature, on the other hand, the energy gap of the Josephson junction is increased and one can obtain a large output current. Thus, one can increase the operational speed when the Josephson device is used for the digital applications. When the device is used for analog applications such as SQUID, on the other hand, one can achieve the reduction of the noise.

As already noted in the previous embodiments, the Josephson device of the present invention has the nitride layer on the upper major surface of the niobium or NbN superconducting electrode as the overlayer. Because of this, the upper major surface of the NbN superconducting electrode is prevented from oxidation even when the half-completed device is taken out from the chamber of the sputtering apparatus. By using this feature, the structure of the Josephson junction of the present embodiment allows the formation of a Josephson device that cannot be formed conventionally. More specifically, the fabrication of the device includes the step of taking out the half-completed device out of the deposition chamber for patterning the same to form Josephson junctions having different critical current levels on a common substrate, similar to the second embodiment.

Next, a fifth embodiment of the present invention will be described with reference to FIG. 20(A) –20(H).

Figure 20A:
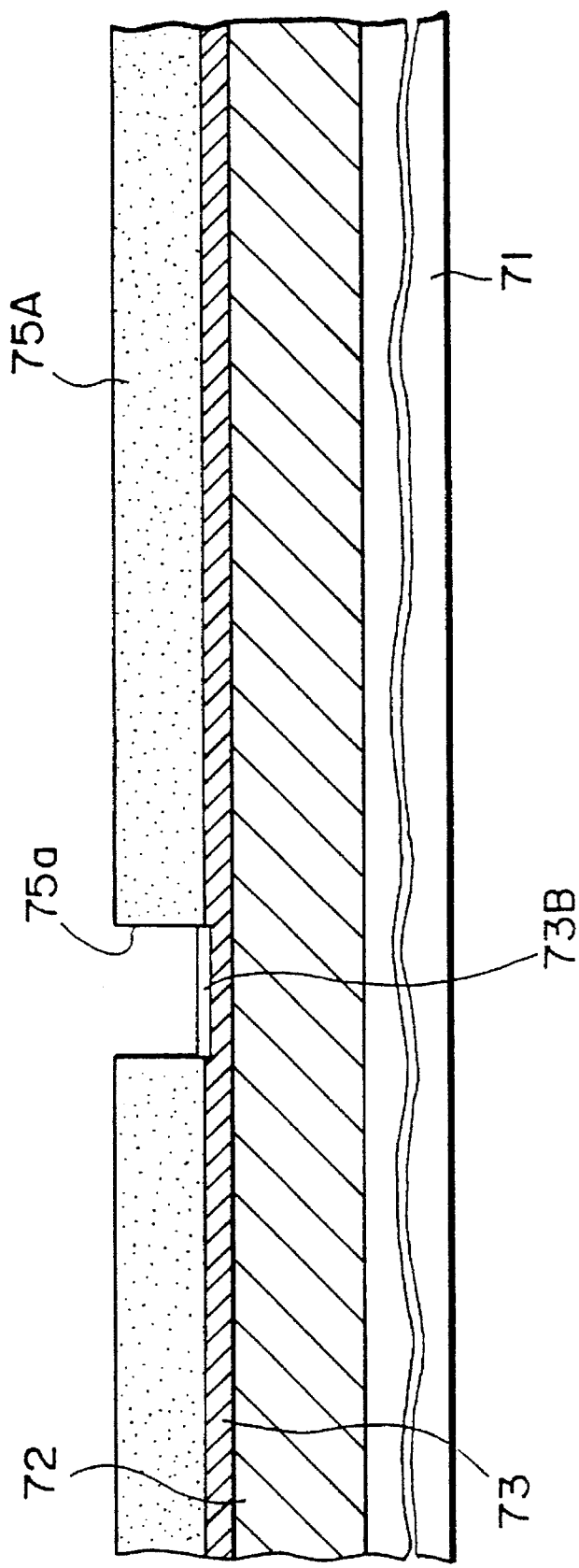
FIGS. 20(A)–20(H) are diagrams showing the fabrication process of the Josephson device according to a fifth embodiment of the present invention.

In the step of FIG. 20(A), a lower electrode layer 72 of NbN is deposited on an upper major surface of a silicon substrate 71 by the r.f. magnatron sputtering process. This process may be conducted similarly to the case of depositing the NbN electrode 62 on the substrate 61 in the step of FIG. 19(A)

Next, the target of Nb is replaced with to Ta, and the r.f. magnetron sputtering process is continued. Thereby, an overlayer 73 of TaN is grown with a thickness of 1–5 nm. Similar to the previous embodiment, the Ta target may be replaced by Zr target. In this case, ZrN is grown as the overlayer 73.

Next, the structure thus obtained is taken out from the chamber of the sputtering apparatus and a photoresist 75A is applied on the upper major surface of the barrier layer 73. Further, the photoresist 75A is patterned to form a window 75a that exposes the upper major surface of the overlayer 73 in correspondence to the part where the barrier layer is to be formed.

Further, the structure thus covered by the photoresist is returned to the chamber of the sputtering apparatus, and oxygen is introduced into the deposition chamber. Thereby, the surface of the TaN overlayer 73 corresponding to the window 75a is exposed and a $TaO_x$ barrier layer 73B is formed on the exposed surface of the TaN overlayer 73 as a result of an r.f. oxidation process. Thereby, the structure shown in FIG. 20(A) is formed. The r.f. oxidation process is carried out under the conditions:

gas: mixture of Ar and 10% $O_2$
pressure: 1:3 Pa
r.f. power: 50 W
duration: 2–3 minutes As noted previously, the value of the critical current of the Josephson junction depends on the thickness of the barrier layer 73B that in turn can be controlled by the oxygen concentration, gas pressure, r.f. power and the duration of oxidation.

Figure 20B:
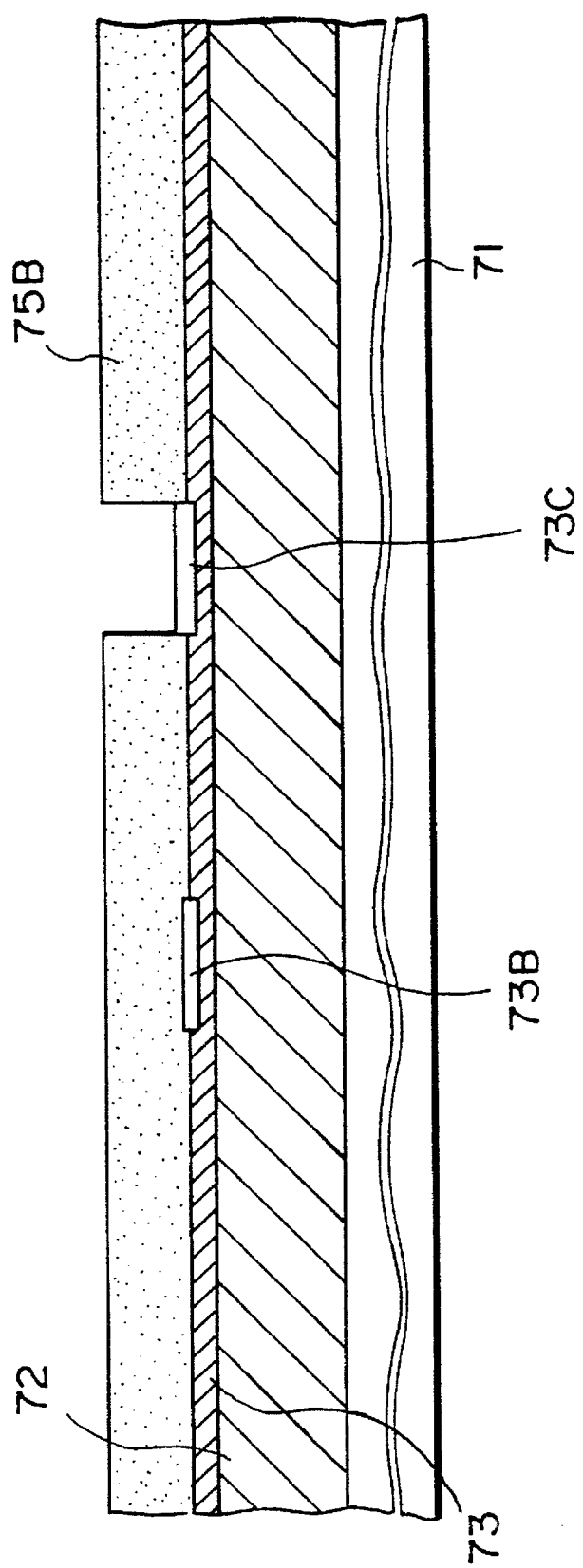
Figure 20:
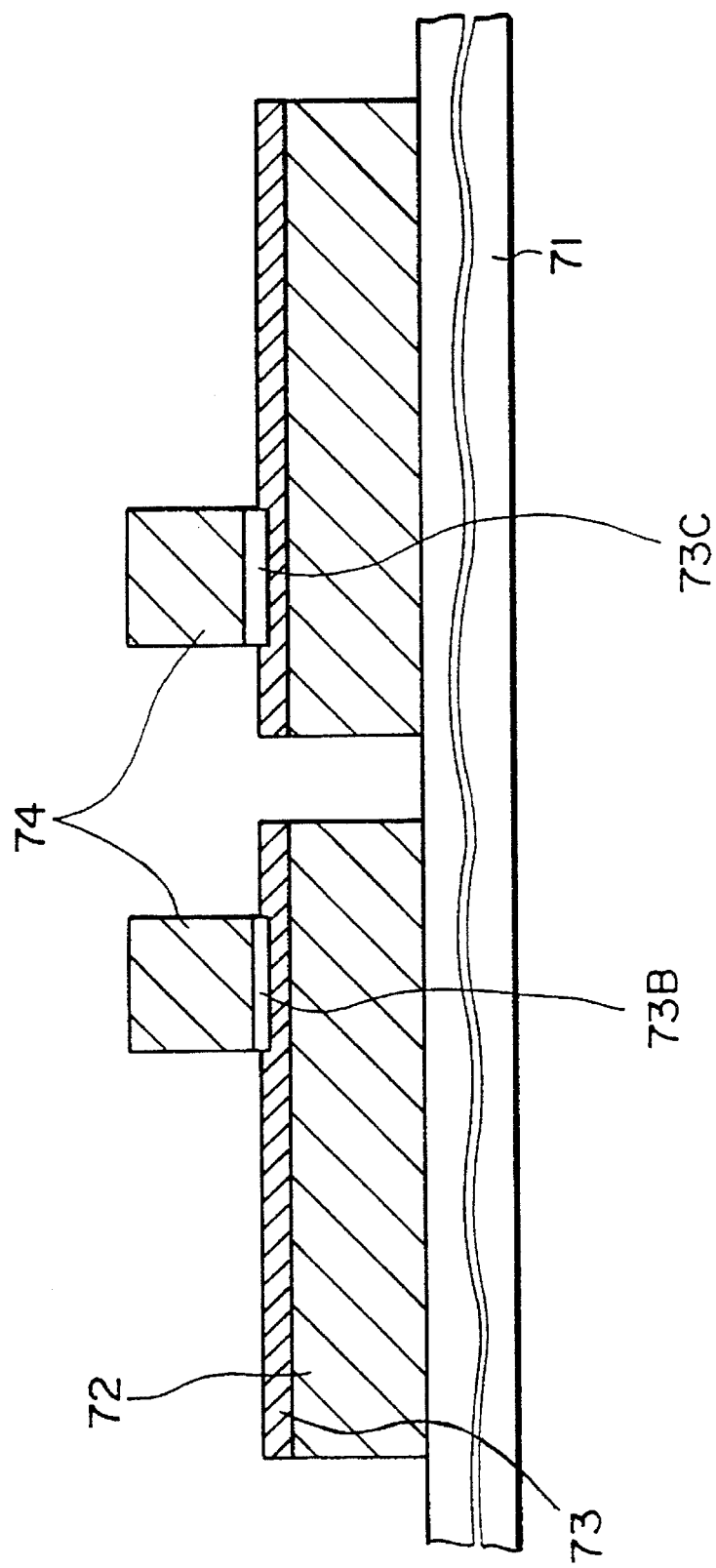
Figure 20:
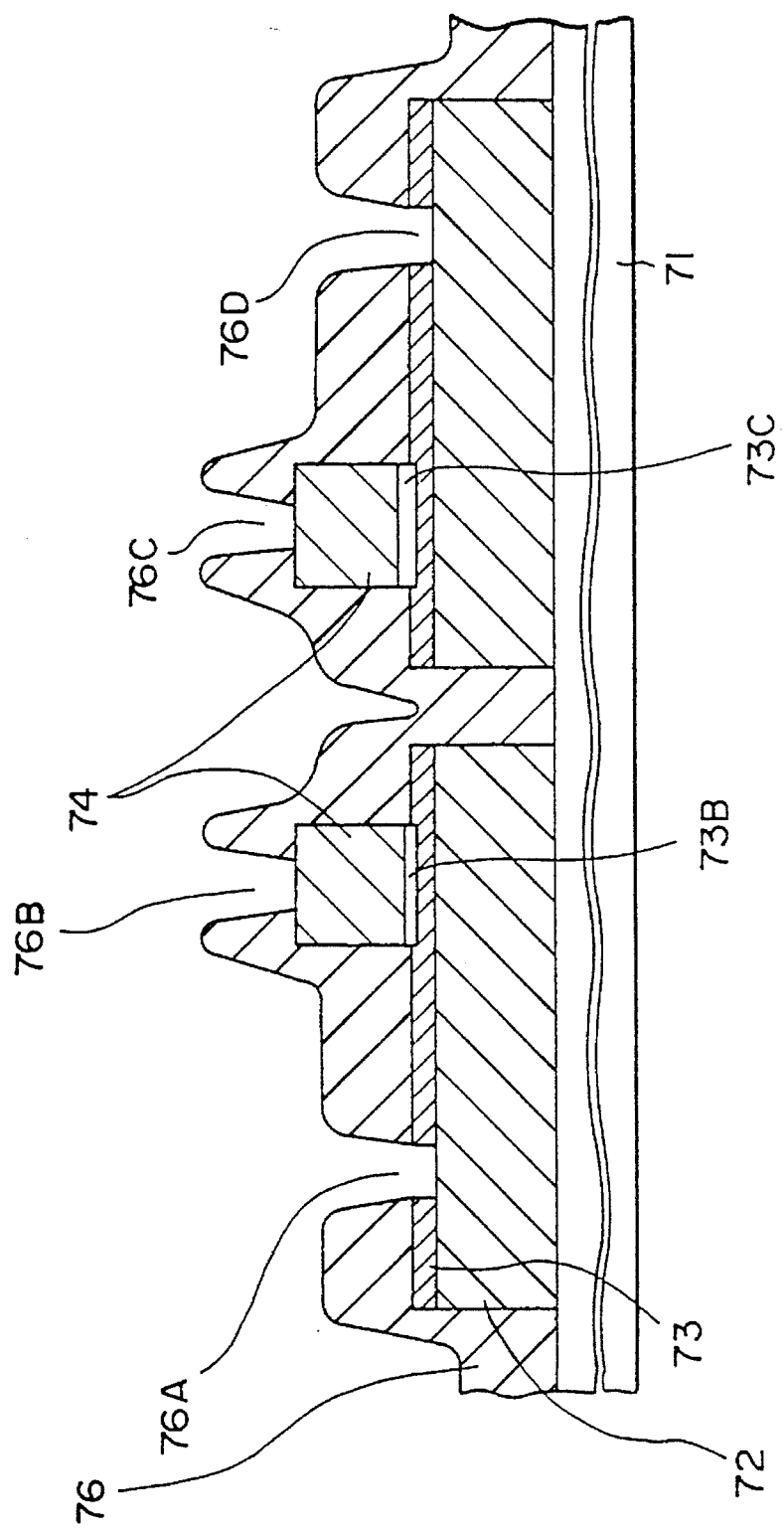

After the forgoing step, the structure thus obtained in taken out from the deposition chamber of the sputtering apparatus and the photoresist 75A is removed. Next, another photoresist 75B is applied on the entire surface of the overlayer 73 including the barrier layer 73B. See FIG. 20(B). The photoresist 75B is patterned to form a window 75b in correspondence to a location where the barrier layer for the second Josephson junction is to be formed. Further, the structure thus formed is returned into the deposition chamber of the sputtering apparatus and subjected to an r.f. oxidation process under the conditions described below:

gas: mixture of Ar and $O_2$ (10%)
pressure: 1.3 Pa
r.f. power: 50 W
duration: 10–120 min Thereby, a barrier layer 73C is formed with a thickness substantially larger than the barrier layer 73B. Thereby, the structure shown in FIG. 20(B) is obtained.

Next, the photoresist 75B is removed and an upper electrode layer 74 of NbN is deposited on the exposed upper major surface of the overlayer 73 including the barrier layers 73B and 73C in a thickness of 150 nm. See the structure of FIG. 20(C).

After the structure of FIG. 20(C) is formed, the structure is taken out from the sputtering apparatus and a photoresist 75C is applied on the upper major surface of the NbN layer 74. Further, the photoresist 75C is patterned to protect the region above the barrier layer 73B and the region above the barrier layer 73C with an area that determines the effective area of the Josephson junction. See the structure of FIG. 20(D).

Next, the structure of FIG. 20(D) is subjected to an RIE process under the following conditions until the upper major surface of the overlayer 73 is exposed:

gas: mixture of $CF_4$ and $O_2$ (5%)

gas flowrate: 50 sccm pressure: 10 Pa r.f. power: 50 W etching rate: 200 nm/min

As a result of the etching, a structure shown in FIG. 20(E) is obtained.

Further, the remaining photoresist 75c is removed and the TaN overlayer 73 as well as the lower NbN electrode 72 are patterned as shown in FIG. 20(F), wherein the NbN electrode 72 is now divided into a first part 72A carrying an overlayer 73-1 and a second part 72B carrying an overlayer 73-2. It should be noted that the overlayer 73 thus is also divided into the first part 73-1 and the second part 73-2. The patterning is carried out by the RIE process under the condition similar to the condition of patterning the NbN upper electrode layer 74.

After removing the photoresist, the structure of FIG. 20(F) is subjected to an r.f. magnetron sputtering process for depositing a silicon oxide insulation layer 76 such that the silicon oxide insulation layer 76 covers the entire surface of the structure of FIG. 20(G). The conditions of the r.f. magnetron sputtering are as follow:

r.f. power: 1 kW gas: Ar gas flowrate: 50 sccm target: $SiO_2$ deposition rate: 8 nm/min thickness: 400 nm.

After forming the $SiO_2$ layer 76, a photolithographic patterning process is applied to form contact holes 76A and 76B for exposing, respectively, the upper major surface of the first lower NbN electrode 72A and the upper major surface of the upper NbN electrode 74 that covers the barrier layer 73B. Similarly, contact holes 76C and 76D are formed through the silicon oxide layer 76 to expose, respectively, the upper major surface of the NbN electrode 74 covering the barrier layer 73C and the upper major surface of the second lower NbN electrode 72B. See the structure of FIG. 20(G). This patterning process may be achieved by an RIE process under the condition as follows.

gas: mixture of $CHF_3$ and $O_2$ (10%)

r.f. power: 100 W etching rate: 30 nm

After the structure of FIG. 20(G) is formed, an NbN interconnection layer (not shown) is deposited on the entire upper major surface of the silicon oxide layer 76 including the contract holes 76A, 76B, 76C and 76D with a thickness of 500 nm. Further, by suitably patterning the NbN interconnection layer thus deposited, a Josephson device shown in FIG. 20(H) is completed. The deposition and patterning of the interconnection pattern may be achieved according to the condition described previously. As a result of patterning, NbN interconnection patterns 77, 78 and 79 are formed.

After removal of the photoresist, one obtains a Josephson device including two Josephson junctions that have different critical current levels.

Next, a sixth embodiment of the present invention will be described with reference to FIGS. 21(A)–21(F). In the present embodiment, the barrier layer is not formed by the oxidation of the overlayer but as a result of conversion of the surface of a TaN overlayer to a $Ta_2N$ barrier layer as a result of a discharge in an inert atmosphere.

Figure 21A:
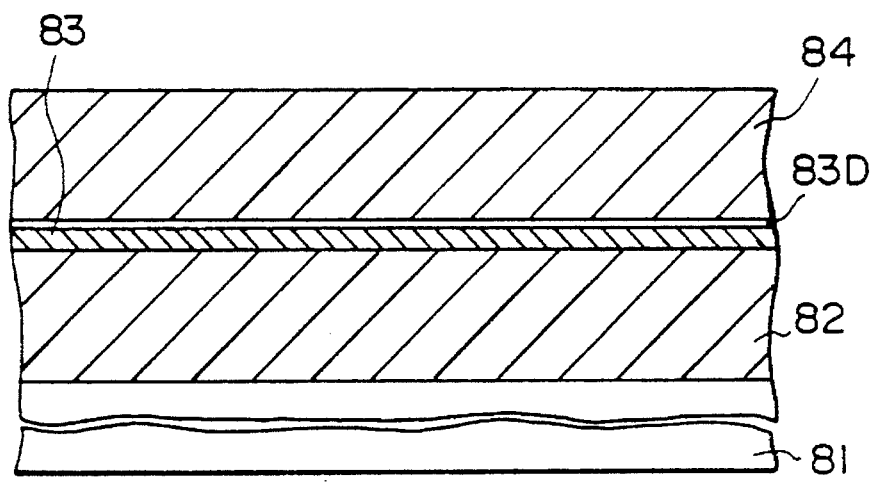
FIGS. 21(A)–21(F) are diagrams showing the fabrication process of the Josephson device according to a sixth embodiment of the present invention.
Figure 21B:
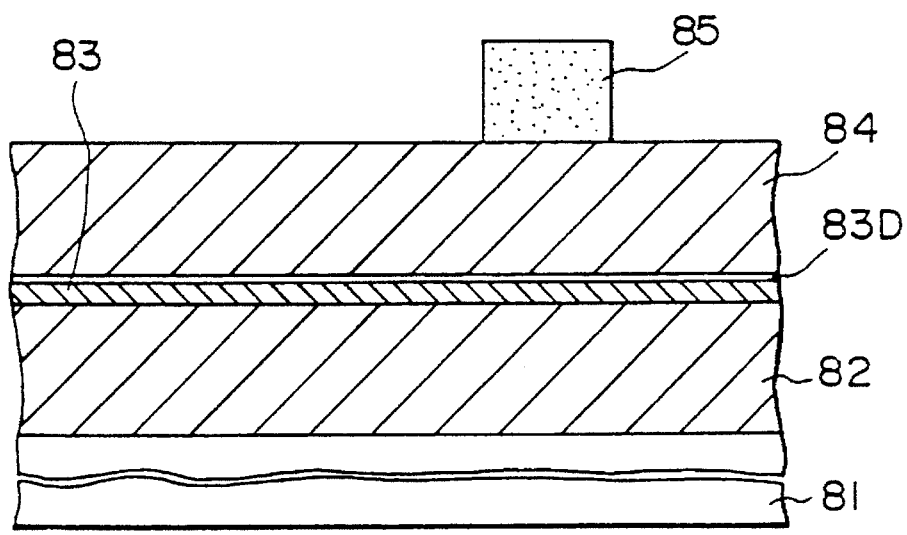
Figure 21C:
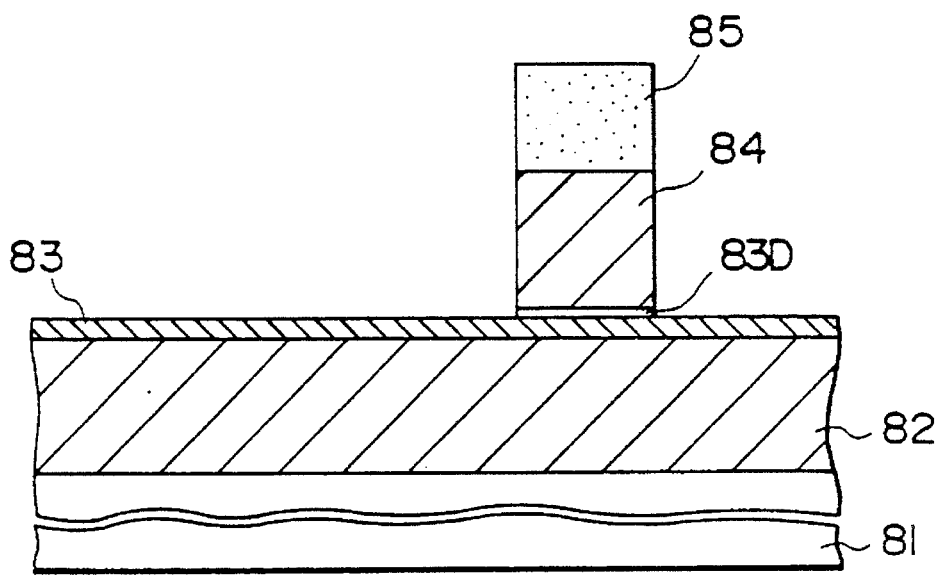

Referring to FIG. 21(A), a lower electrode layer 82 of NbN is deposited on the upper major surface of a silicon substrate 81 by the r.f. magnetron sputtering process while using a niobium target. The deposition may be achieved according to conditions identical with those in the previous embodiment for depositing the NbN electrode 72.

Next, the niobium target is replaced with tantalum and an overlayer 83 of tantalum is grown on the upper major surface of the electrode layer 82 with a thickness of 1–5 nm.

Further, the nitrogen partial pressure in the deposition chamber of the sputtering apparatus is reduced and a barrier layer 83D of $Ta_2N$ is formed on the upper major surface of the overlayer 83 by establishing an r.f. discharge. For example, the r.f. discharge is caused according to the following condition:

gas: mixture of Ar and $N_2$ (10–50%)

pressure: 1.3 Pa r.f. power: 50 W duration: 2–3 minutes

As is usual in the Josephson junction, the critical current through the barrier layer 83D depends on the thickness of the layer 83D as well as the nitrogen concentration, gas pressure, r.f. power and the duration of r.f. discharge.

Next, an upper NbN electrode layer 84 is deposited on the upper major surface of the barrier layer 83D in a thickness of about 150 nm according to conditions identical with the conditions for depositing the lower NbN electrode layer 82. Thereby, one obtains the structure shown in FIG. 21(A).

Next, the structure is taken out from the deposition chamber of the sputtering apparatus and has applied thereto a photoresist. The photoresist is patterned subsequently to form a photoresist pattern 85 that protects the upper major surface of the upper NbN electrode 84 in correspondence to the location where the Josephson junction is to be formed. See the structure of FIG. 21(B).

Next, an RIE process is applied while using the photoresist pattern 85 as the mask. Thereby, the NbN layer 84 and the underlying $Ta_2N$ barrier layer 83D are etched until the upper major surface of the overlayer 83 is exposed. See the structure of FIG. 21(C). For example, the RIE process may be achieved according to the following conditions:

(A) etching of the NbN electrode layer 84 etching gas: mixture of $CF_4$ and $O_2$ (5%)

flowrate: 50 sccm pressure: 10 Pa r.f. power: 50 W etching rate: 200 nm/min (B) etching of the $Ta_2N$ barrier layer 83D etching gas: Ar flowrate: 10 sccm pressure: 0.5 Pa r.f. power: 100 W etching rate: 3 nm/min Next, the TaN overlayer 83 and the NbN lower electrode layer 82 are subjected to a patterning process similar to the one used in the previous embodiments. Thereby, a structure shown in FIG. 21(D) is obtained.

Figure 21D:
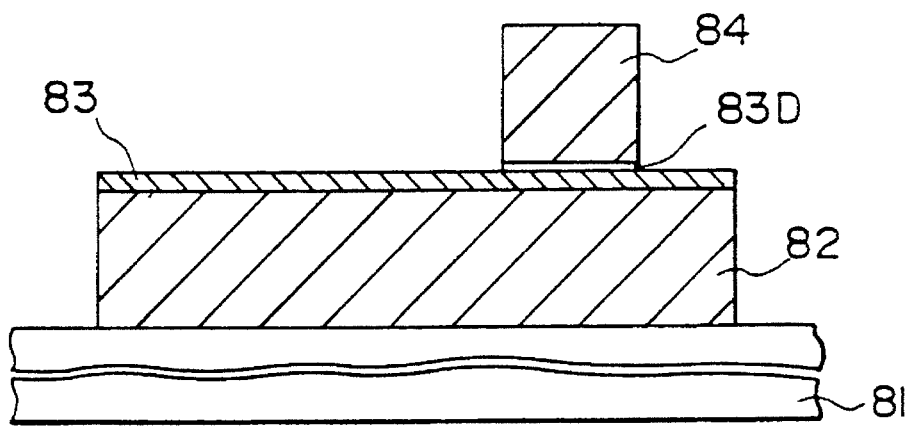
Figure 21E:
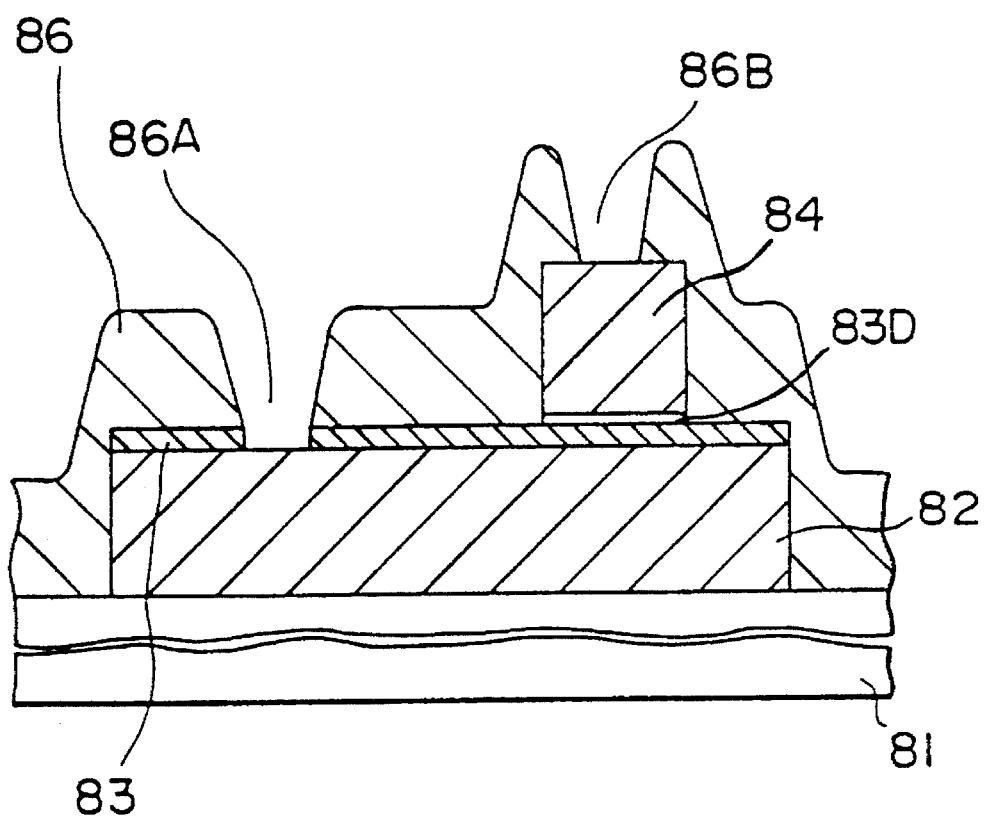

Further, in the step of FIG. 21(E), a silicon oxide layer 86 is provided on the structure of FIG. 21(D) in a thickness of about 400 nm by an r.f. magnetron sputtering process similar to the ones used for forming the silicon oxide layer 76. Further, by applying an RIE process, similarly to the previous embodiments, contact holes 86A and 86B are formed to expose therethrough corresponding portions of the upper major surface of the lower NbN electrode layer 82 and the upper major surface of the upper NbN electrode layer 34. See the structure of FIG. 21(E).

Figure 21F:
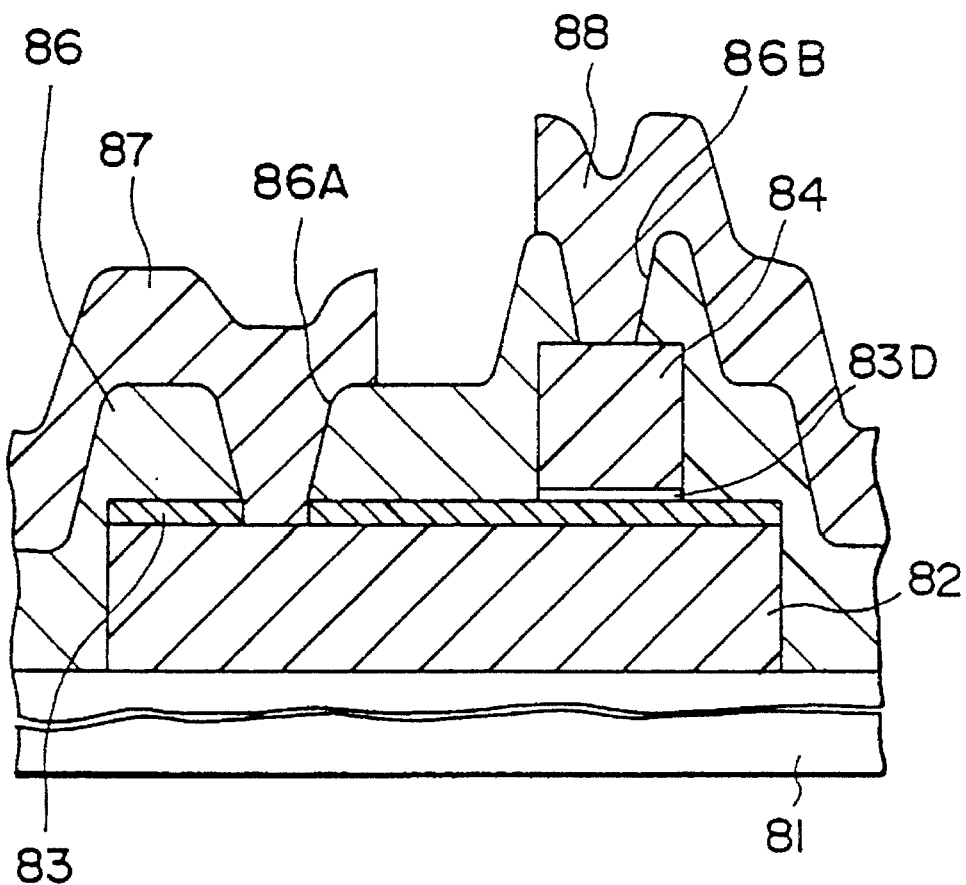

Next, in the step of FIG. 21(F), NbN interconnection patterns 87 and 88 are provided in contact with the NbN electrode layer 82 and the NbN electrode layer 84, respectively, via the contact holes 86A and 86B. The NbN patterns 87 and 88 are formed by first depositing an NbN layer by an r.f. magnetron sputtering process similar to that of the previous embodiments in a thickness of about 500 nm and subsequently patterning by the RIE process conducted also similarly to the previous embodiments. In the present embodiment, the critical current of the Josephson junction can be controlled as desired by controlling the thickness of the barrier layer 83D. This is easily achieved by controlling the duration of the r.f. discharge process or the partial pressure of $O_2$ or $N_2$ at the time of the r.f. discharge.

Next, a seventh embodiment of the present invention will be described with reference to FIGS. 22(A)–22(F).

Figure 22A:
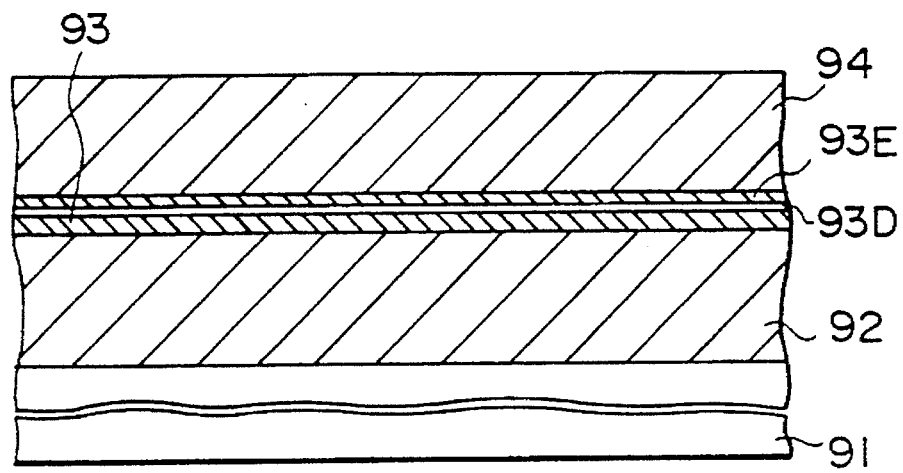
FIGS. 22(A)–22(F) are diagrams showing the fabrication process of the Josephson device according to a seventh embodiment of the present invention.

Referring to the step of FIG. 22(A), an NbN electrode layer 92 is formed on the upper major surface of a silicon substrate 91 by an r.f. magnetron sputtering process that is conducted under similar conditions as in the previous embodiments. Next, the target is replaced with tantalum and an overlayer 93 is grown on the electrode layer 92 in a thickness of 1–5 nm. This process is conducted similarly to the previous embodiments. Further, the pressure of nitrogen is reduced and a barrier layer of $Ta_2N$ is formed on the upper major surface of the overlayer 93 by an r.f. discharge process under conditions similar to those of the previous embodiment. More specifically, the r.f. discharge process is carried out under the following conditions:

gas: mixture of Ar and $N_2$ (10–50%)
pressure: 1.3 Pa
r.f. power: 50 W
duration: 2–3 minutes In the present embodiment, the thickness of the barrier layer 93D is controlled, after the layer 93D is formed, by nitriding the surface of the $Ta_2N$ barrier layer. The nitridation is caused by an r.f. enhanced nitridation process that is conducted according to the following conditions:

gas: mixture of Ar and $N_2$ (10–50%)
pressure: 1.3 Pa
r.f. power: 50 W
duration: 2–3 minutes In response to the nitridation process, the surface of the barrier layer 93D is converted to a TaN layer 93E and the effective thickness of the $Ta_2N$ barrier layer 93D is reduced. For example, one can reduce the thickness of the layer 93D to about 1–2 nm. After the formation of the TaN layer 93E, an upper electrode layer 94 of NbN is deposited similarly as before with the thickness of about 150 nm, for example. Thereby, the structure shown in FIG. 22(A) is obtained.

Figure 22B:
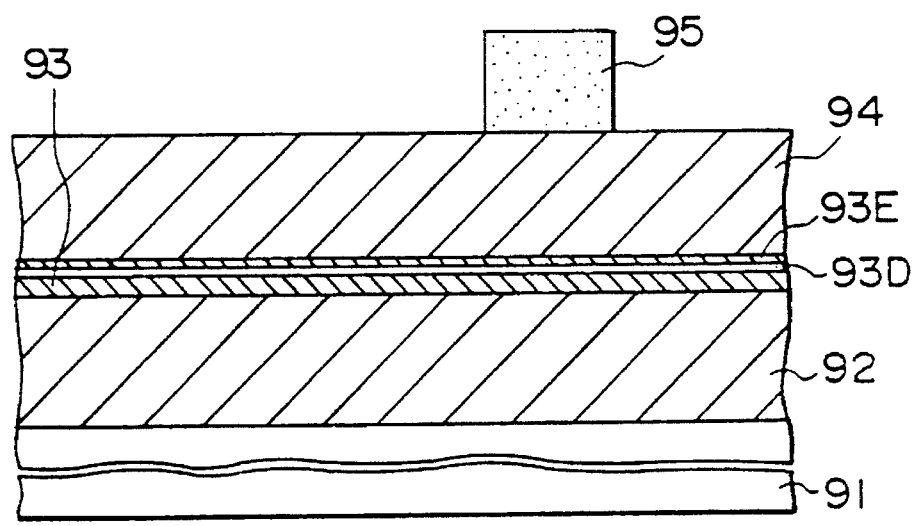

Next, in the step of FIG. 22(B), the structure thus obtained is taken out from the deposition chamber of the sputtering apparatus and subjected photolithographic patterning process as shown in FIG. 22(B). Thereby, a photoresist pattern 95 is formed on the upper major surface of the NbN upper electrode layer 94 to protect a part corresponding to that where the Josephson junction is to be formed.

Figure 22C:
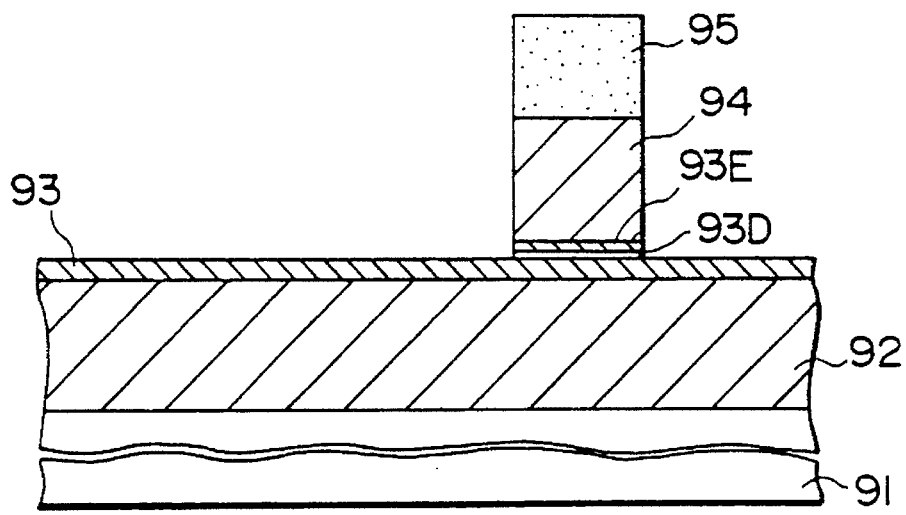

Next, while using the photoresist pattern 95 as the mask, an RIE process is applied to remove the layers 93D, 93E and 94 in those parts thereof not protected by the photoresist pattern 95. The RIE process may be conducted under the following conditions:

(A) for the NbN layer 94
  gas: mixture of $CF_4$ and $O_2$ (5%)
  gas flowrate: 50 sccm
  pressure: 10 Pa
  r.f. power: 50 W
  etching rate: 200 nm/min (B) for the TaN layer 93
  gas: Ar
  gas flowrate: 10 sccm
  pressure: 0.5 Pa
  r.f. power: 100 W
  etching rate: 3 nm/min The RIE processing of the barrier layer 93D is achieved similarly to the etching of the barrier layer 83D of the previous embodiment. Thereby, a structure shown in FIG. 22(C) is obtained. After the removal of the patterned photoresist 95, the TaN overlayer 93 and the underlying NbN electrode layer 92 are patterned, similarly to that of to the previous embodiment, and the structure shown in FIG. 22(D) is obtained.

Figure 22D:
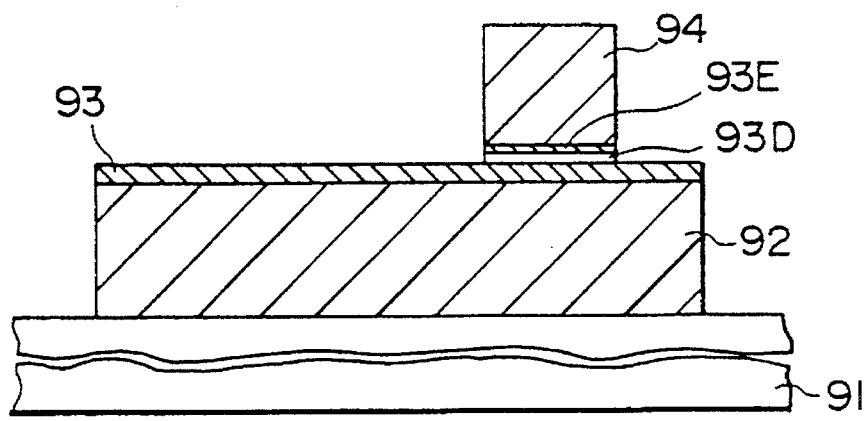
Figure 22E:
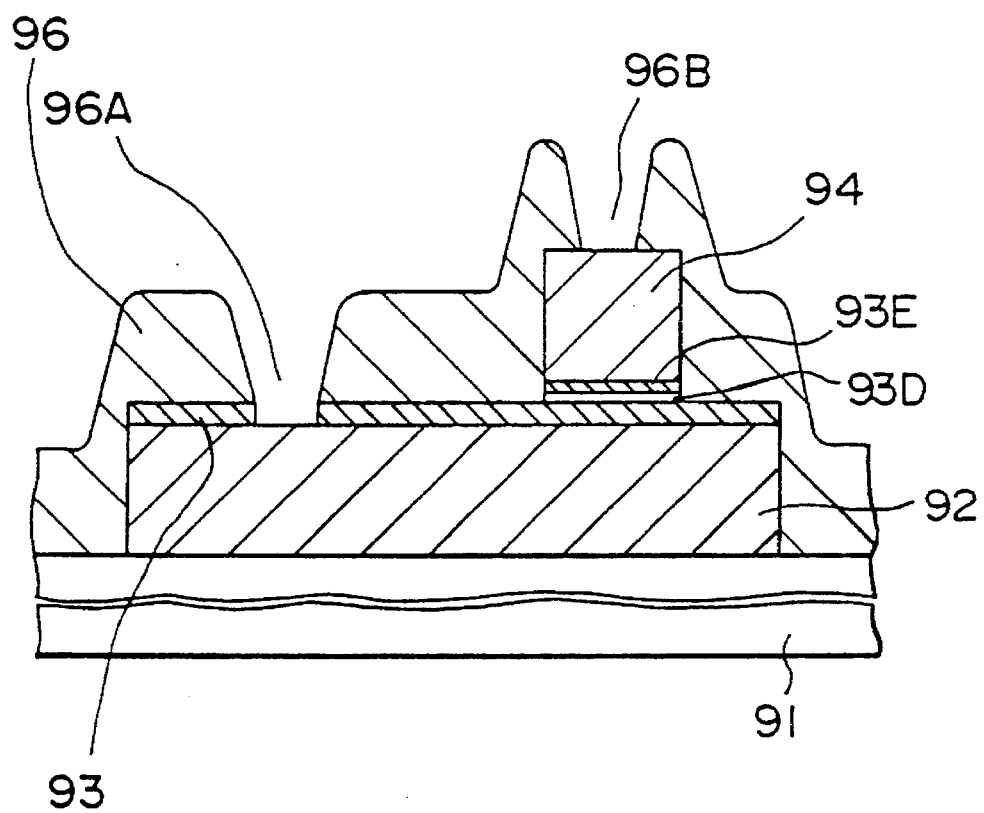

Further, a deposition of a silicon oxide insulation layer 96 on the structure of FIG. 22(D) is achieved by an r.f. magnetron sputtering process, similarly as before, and contact holes 96A and 96B are formed in the silicon oxide insulation layer 96 thereby to expose corresponding portions of the upper major surface of the NbN electrode layer 92 and the NbN electrode layer 94, respectively, as shown in FIG. 22(E). The contact holes 96A and 96B are formed by the RIE process, similarly as before.

Figure 22F:
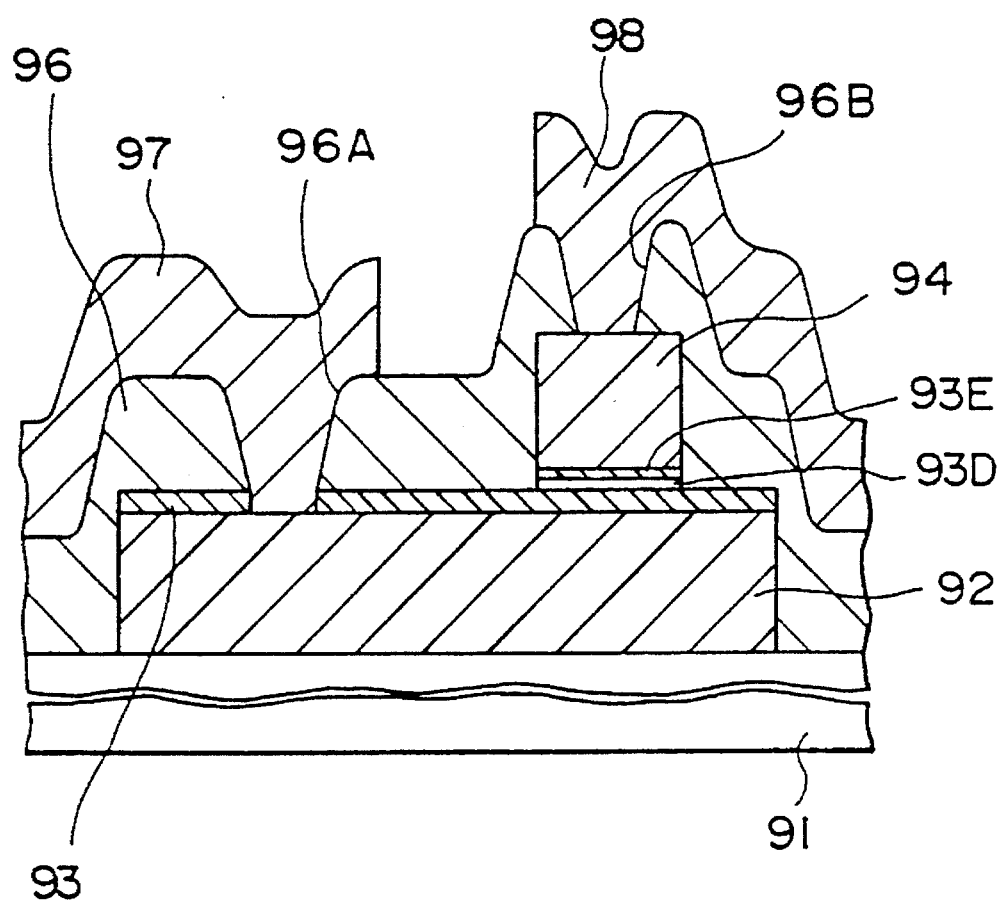

Further, NbN interconnection patterns 97 and 98 are provided on the upper major surface of the silicon oxide layer 96 respectively in contact with the upper major surface of the NbN electrode layer 92 and the NbN electrode layer 94 via the respective contact holes 96A and 96B. The interconnection patterns 97 and 98 are formed by depositing a layer of NbN uniformly over the silicon oxide insulation layer 96 and patterning the same subsequently by the RIE process. The RIE process may be performed similarly to that in the previous embodiments. Thereby, a structure shown in FIG. 22(F) is obtained.

As noted already, the Josephson device of the fourth through seventh embodiment uses NbN for the superconducting electrodes of the Josephson junction and is capable of operating at a temperature higher than 10K. Thereby, one can simplify the cooling system needed for operating the Josephson devices and Josephson integrated circuits. Further, by operating the Josephson devices using such a high Tc material for the electrode of the Josephson junction, one can increase the energy gap and hence the current obtained through the Josephson junction. Thereby, the operational speed of the device is increased in the digital applications and the signal-to-noise ratio of the device is improved in the analog applications. The material for the high Tc electrode is not limited to NbN but other materials having a sufficiently large coherent length such as NbCN or a mixture of NbN and NbCN may be employed also.

In the structure of the third embodiment of the present invention, it should be noted that one may use NbN or NbCN for the material of the electrode layers 52 and 56. Thus, the Josephson device having the structure of FIG. 18(G) with the electrode layers 52 and 56 formed of NbN or NbCN forms an eighth embodiment of the present invention. As already explained, the structure of the FIG. 18(G) has the first nitride overlayer 53 and the second metal overlayer 54 and is characterized by an excellent voltage-current characteristic of the Josephson junction due to the thermal oxidation process used for forming the barrier layer 55. With the use of the high Tc material for the electrode, one can operate the device under the 10K environment.

In any of the foregoing embodiments, it should be noted that the material for the nitride overlayer is not limited to ZrN or TaN but other nitrides of a refractory metal such as HfN, GaN and SiN may be used. In correspondence thereto, oxides of a refractory metal such as $HfO_x$, $GaO_x$ or $SiO_x$ may be used for the barrier layer.

Further, the present invention is not limited to the embodiments described heretofore, but various variations and modifications may be made without departing from the scope of the invention.

What is claimed is:

1. A Josephson device, comprising:
   a first electrode layer of a superconducting material containing Nb as a constituent element, said first electrode layer having upper and lower major surfaces;
   an overlayer of a nitride of a metal element, said overlayer having upper and lower major surfaces and being provided on the first electrode layer;
   a barrier layer of an insulating material containing said metal element as a constituent element and acting as a barrier layer of a Josephson junction, said barrier layer having upper and lower major surfaces and being provided on said upper major surface of said overlayer;
   a second electrode layer of a superconducting material containing Nb therein as a constituent element, said second electrode layer having upper and lower major surfaces and being provided on said upper major surface of said barrier layer;
   each of said first and second electrode layers having a coherent length and said overlayer having a thickness, measured between the upper and lower major surfaces thereof, which is less than said coherent length; and
   said nitride of said metal element, of said overlayer, consisting essentially of ZrN, and said insulting material of said barrier layer consisting essentially of $Zro_x$.

2. A Josephson device as claimed in claim 1, wherein each of the respective materials of said first and second electrode layers consists essentially of Nb.

3. A Josephson device as claimed in claim 1, in which said overlayer has a thickness of less than 10 nm.

4. A Josephson device as claimed in claim 1, in which said lower major surface of said barrier layer is coincident with said upper major surface of said overlayer.

5. A Josephson device as claimed in claim 1, in which each of said respective superconducting materials of said first and second electrode layers is selected from the group consisting of NbN, NbCN and a mixture thereof.

6. A Josephson device, comprising:
   a first electrode layer of a superconducting material containing Nb as a constituent element, said first electrode layer having upper and lower major surfaces;
   an overlayer of a nitride of a metal element, said overlayer having upper and lower major surfaces and being provided on the first electrode layer;
   a barrier layer of an insulting material containing said metal element as a constituent element and acting as a barrier layer of a Josephson junction, said barrier layer having upper and lower major surfaces and being provided on said upper major surface of said overlayer;
   a second electrode layer of a superconducting material containing Nb therein as a constituent element, said second electrode layer having upper and lower major surfaces and being provided on said upper major surface of said barrier layer;
   each of said first and second electrode layers having a coherent length and said overlayer having a thickness, measured between the upper and lower major surfaces thereof, which is less than said coherent length; and
   said nitride of said metal element, of said overlayer, consisting essentially of TaN, and said insulating material of said barrier layer consisting essentially of $TaO_x$.

7. A Josephson device as claimed in claim 6, wherein each of the respective materials of said first and second electrode layers consists essentially of Nb.

8. A Josephson device as claimed in claim, in which said overlayer has a thickness of less than 10 nm.

9. A Josephson device as claimed in claim 6, in which each of said respective superconducting materials of said first and second electrode layers is selected from the group consisting of NbN, NbCN and a mixture thereof.

10. A Josephson device, comprising:
    a first electrode layer of a superconducting material containing Nb as a constituent element, said first electrode layer having upper and lower surfaces;
    an overlayer of a nitride of a metal element, said overlayer having upper and lower major surfaces and being provided on the first electrode layer;
    a barrier layer of an insulting material containing said metal element as a constituent element and acting as a barrier layer of a Josephson junction, said barrier layer having upper and lower major surfaces and being provided on said upper major surface of said overlayer;
    a second electrode layer of a superconducting material containing Nb therein as a constituent element, said second electrode layer having upper and lower major surfaces and being provided on said upper major surface of said barrier layer;
    each of said first and second electrode layers having a coherent length and said overlayer having a thickness, measured between the upper and lower major surfaces thereof, which is less than said coherent length; and
    said nitride of said metal element, of said overlayer, consisting essentially of TaN and said insulating material of said barrier layer consisting essentially of $Ta_2N$.

11. A Josephson device as claimed in claim 10, further comprising a layer of TaN disposed between the upper major surface of the barrier layer and the lower major surface of the second electrode layer.

12. A Josephson device as claimed in claim 10, wherein each of the respective materials of said first and second electrode layers consists essentially of Nb.

13. A Josephson device as claimed in claim 10, in which said overlayer has a thickness of less than 10 nm.

14. A Josephson device as claimed in claim 10, in which each of said respective superconducting materials of said first and second electrode layers is selected from the group consisting of NbN, NbCN and a mixture thereof.

* * * * *

UNITED STATES PATENT AND TRADEMARK OFFICE
CERTIFICATE OF CORRECTION

PATENT NO. : 5,477,061
DATED : Dec. 19, 1995
INVENTOR(S) : MOROHASHI

It is certified that error appears in the above-indentified patent and that said Letters Patent is hereby corrected as shown below:

TITLE PAGE:
Item
[56] References Cited: OTHER PUBLICATIONS, second column, line 4 (the Asano et al. reference), change "Al-Nb" to --All-Nb--.

Col. 1, line 57, delete "barrier layer tends to";
line 58, delete "react with niobium upon the".

Col. 2, line 46, change "game" to --same--.

Col. 3, line 2, change "include" to --includes--;
line 8, change "coerced" to --circuit--;
line 47, change "130a and" to --130a' and--;
line 48, change "130b" to --130b'--;
line 66, change "substantial" to --substantially--;
line 67, after "state" (second occurrence), insert --(not shown)--.

Col. 5, line 26, change "a" to --as a--;
line 65, change "To" to --Tc--.

Col. 8, line 56, after "subjected to" insert --heat--.

Col. 11, line 42, delete "40a".

Col. 18, line 12, change "with to" to --with--;
line 66, after "73C" insert --,--.

UNITED STATES PATENT AND TRADEMARK OFFICE
CERTIFICATE OF CORRECTION

PATENT NO. : 5,477,061
DATED : Dec. 19, 1995
INVENTOR(S) : MOROHASHI

It is certified that error appears in the above-indentified patent and that said Letters Patent is hereby corrected as shown below:

Col. 19, line 61, change "contract holes" to --contact holes--.

Col. 21, line 4, change "ones" to --one--;
line 9, change "layer 34" to --layer 84--;
line 64, after "subjected" insert --to a--.

Col. 22, line 23, delete "to" (second occurrence).

Col. 24, line 18 (Claim 8, line 1), after "claim" insert --6--.

Signed and Sealed this

Twenty-fifth Day of June, 1996

Attest:

BRUCE LEHMAN

*Attesting Officer*     *Commissioner of Patents and Trademarks*